(12) United States Patent
Painter et al.

(10) Patent No.: US 11,649,160 B2
(45) Date of Patent: *May 16, 2023

(54) TECHNIQUES FOR TRANSDUCTION AND STORAGE OF QUANTUM LEVEL SIGNALS

(71) Applicant: California Institute of Technology, Pasadena, CA (US)

(72) Inventors: Oskar Painter, Sierra Madre, CA (US); Jie Luo, Pasadena, CA (US); Michael T. Fang, Pasadena, CA (US); Alp Sipahigil, Pasadena, CA (US); Paul B. Dieterle, Somerville, MA (US); Mahmoud Kalaee, Pasadena, CA (US); Johannes M. Fink, Klosterneuburg (AT); Andrew J. Keller, Los Angeles, CA (US); Gregory MacCabe, Los Angeles, CA (US); Hengjiang Ren, Pasadena, CA (US); Justin D. Cohen, Annandale, VA (US)

(73) Assignee: California Institute of Technology, Pasadena, CA (US)

( * ) Notice: Subject to any disclaimer, the term of this patent is extended or adjusted under 35 U.S.C. 154(b) by 50 days.

This patent is subject to a terminal disclaimer.

(21) Appl. No.: 17/087,316

(22) Filed: Nov. 2, 2020

(65) Prior Publication Data
US 2021/0139315 A1 May 13, 2021

Related U.S. Application Data

(62) Division of application No. 16/293,455, filed on Mar. 5, 2019, now Pat. No. 10,858,239.

(Continued)

(51) Int. Cl.
*H01L 29/84* (2006.01)
*B81B 3/00* (2006.01)
(Continued)

(52) U.S. Cl.
CPC .......... *B81B 3/0029* (2013.01); *B81B 3/0021* (2013.01); *B82Y 10/00* (2013.01);
(Continued)

(58) Field of Classification Search
CPC ..... B81B 3/0021; B81B 3/0029; B82Y 10/00; B82Y 20/00; B82Y 40/00; G06N 10/00; G01H 11/08; G11C 13/025
(Continued)

(56) References Cited

U.S. PATENT DOCUMENTS 6,518,637 B1 2/2003 Thompson et al.
7,295,153 B2 11/2007 Williams
(Continued)

OTHER PUBLICATIONS

U.S. Appl. No. 16/293,416, "Notice of Allowance", dated Sep. 24, 2020, 10 pages.
(Continued)

*Primary Examiner* — Tan N Tran
(74) *Attorney, Agent, or Firm* — Kilpatrick Townsend & Stockton LLP

(57) ABSTRACT

Embodiments described herein include systems and techniques for converting (i.e., transducing) a quantum-level (e.g., single photon) signal between the three wave forms (i.e., optical, acoustic, and microwave). A suspended crystalline structure is used at the nanometer scale to accomplish the desired behavior of the system as described in detail herein. Transducers that use a common acoustic intermediary transform optical signals to acoustic signals and vice versa as well as microwave signals to acoustic signals and vice versa. Other embodiments described herein include systems and techniques for storing a qubit in phonon memory having an extended coherence time. A suspended (Continued)

crystalline structure with specific geometric design is used at the nanometer scale to accomplish the desired behavior of the system.

10 Claims, 16 Drawing Sheets

Related U.S. Application Data

(60) Provisional application No. 62/652,197, filed on Apr. 3, 2018, provisional application No. 62/652,194, filed on Apr. 3, 2018, provisional application No. 62/652,200, filed on Apr. 3, 2018, provisional application No. 62/638,829, filed on Mar. 5, 2018, provisional application No. 62/638,817, filed on Mar. 5, 2018.

(51) Int. Cl.
| | | |
|---|---|---|
| *B82Y 40/00* | (2011.01) | |
| *B82Y 10/00* | (2011.01) | |
| *G11C 13/02* | (2006.01) | |
| *B82Y 20/00* | (2011.01) | |
| *G06N 10/00* | (2022.01) | |
| *G01H 11/08* | (2006.01) | |

(52) U.S. Cl.
CPC ............... *B82Y 20/00* (2013.01); *B82Y 40/00* (2013.01); *G01H 11/08* (2013.01); *G06N 10/00* (2019.01); *G11C 13/025* (2013.01)

(58) Field of Classification Search
USPC .......................................................... 257/9
See application file for complete search history.

(56) References Cited

U.S. PATENT DOCUMENTS

| | | | |
|---|---|---|---|
| 7,391,288 B1 | 6/2008 | Itoh et al. | |
| 8,222,065 B1* | 7/2012 | Smeys | ................. B06B 1/0292 |
| | | | 600/459 |
| 8,242,799 B2 | 8/2012 | Pesetski et al. | |
| 8,519,803 B2 | 8/2013 | McLaren et al. | |
| 8,947,317 B2 | 2/2015 | Ueda et al. | |
| 9,843,312 B2 | 12/2017 | Abdo | |
| 10,491,221 B1 | 11/2019 | Mckay et al. | |
| 10,858,239 B2 | 12/2020 | Painter et al. | |
| 10,858,240 B2 | 12/2020 | Painter et al. | |
| 11,311,274 B2* | 4/2022 | Rothberg | ................. A61B 8/56 |
| 2013/0200394 A1 | 8/2013 | Sung | |
| 2017/0346149 A1* | 11/2017 | Ciubotaru | ............... H01F 10/32 |
| 2018/0164432 A1* | 6/2018 | Lal | .......................... G01S 15/02 |

OTHER PUBLICATIONS

U.S. Appl. No. 16/293,455, "Notice of Allowability", dated Oct. 19, 2020, 5 pages.
U.S. Appl. No. 16/293,455, "Notice of Allowance", dated Aug. 5, 2020, 12 pages.
U.S. Appl. No. 16/293,457, "Corrected Notice of Allowability", dated Oct. 19, 2020, 6 pages.
U.S. Appl. No. 16/293,457, "Notice of Allowance", dated Aug. 5, 2020, 13 pages.
U.S. Appl. No. 17/087,400, "Ex Parte Quayle Action", dated Mar. 3, 2022, 7 pages.
U.S. Appl. No. 17/087,400, "Notice of Allowance", dated Apr. 28, 2022, 9 pages.

* cited by examiner

TECHNIQUES FOR TRANSDUCTION AND STORAGE OF QUANTUM LEVEL SIGNALS

CROSS-REFERENCES TO RELATED APPLICATIONS

This application is a division of U.S. Non-Provisional patent application Ser. No. 16/293,455, filed on Mar. 5, 2019, entitled "Techniques for Transduction and Storage of Quantum Level Signals," which claims priority to U.S. Provisional Patent Application No. 62/638,817, filed on Mar. 5, 2018, entitled "Integrated Acoustic and Superconducting Quantum Circuits," U.S. Provisional Patent Application No. 62/638,829, filed on Mar. 5, 2018, entitled "Silicon-on-insulator-based Platform for Low-loss Superconducting Microwave Circuits," U.S. Provisional Patent Application No. 62/652,194, filed on Apr. 3, 2018, entitled "Ultra-Coherent Thin-Film Microwave Acoustic Bandgap Quantum Phonon Memory," U.S. Provisional Patent Application No. 62/652,197, filed on Apr. 3, 2018, entitled "Parametric RF-Mems for Advanced Microwave Signal Processing," and to U.S. Provisional Patent Application No. 62/652,200, filed on Apr. 3, 2018, entitled "Electro-Opto-Mechanical Crystals: Parametric Metasurfaces for Classical Signal Processing and Thermal Management," the disclosures of which are hereby incorporated by reference in their entirety for all purposes.

The following regular U.S. patent applications were filed concurrently with U.S. Non-Provisional patent application Ser. No. 16/293,455, and the entire disclosure of the applications are incorporated by reference into this application for all purposes:

application Ser. No. 16/293,455, filed Mar. 5, 2019, entitled "TECHNIQUES FOR TRANSDUCTION AND STORAGE OF QUANTUM LEVEL SIGNALS";

application Ser. No. 16/293,457, filed Mar. 5, 2019, entitled "TECHNIQUES FOR BIDIRECTIONAL TRANSDUCTION OF QUANTUM LEVEL SIGNALS BETWEEN OPTICAL AND MICROWAVE FREQUENCIES USING A COMMON ACOUSTIC INTERMEDIARY"; and application Ser. No. 16/293,416, filed Mar. 5, 2019, entitled "METAMATERIAL WAVEGUIDES AND SHIELDED BRIDGES FOR QUANTUM CIRCUITS".

STATEMENT AS TO RIGHTS TO INVENTIONS MADE UNDER FEDERALLY SPONSORED RESEARCH OR DEVELOPMENT

This invention was made with government support under Grant No. PHY1125565 awarded by the National Science Foundation and Grant No(s). FA9550-16-1-0323 & FA9550-15-1-0015 awarded by the Air Force and Grant No. N00014-15-1-2761 awarded by the Office of Naval Research. The government has certain rights in the invention.

BACKGROUND

Quantum computing employs quantum bits called qubits to represent data and is of interest for modeling quantum systems and implementing quantum algorithms including performing complex and/or difficult computing tasks that may be beyond the capability of classical computers. Example computations in which a quantum computer may find application include simulation of quantum systems themselves, modeling of the chemical or biological properties of complex molecules, searching through large data sets, finding approximately optimal solutions to problems with many degrees of freedom, factoring large numbers, or distributing quantum information within a network. Quantum systems can include, for example, particles, atoms, molecules, and materials; dynamics such as chemical reactions may also be modeled. Quantum algorithms can include, for example, Grover's algorithm to search efficiently through a large dataset. To perform quantum computations, the quantum state of one qubit (or an ensemble of qubits) must be able to modify the quantum state of another qubit or set of qubits. In a canonical quantum computing architecture, this interaction between qubits is mediated via a quantum bus, which is a loose analog to a traditional computing bus in which information is transferred between different parts of a computer.

Superconducting qubits based on Josephson junctions conventionally operate and communicate at microwave frequencies (e.g., 2-10 GHz) using extremely small quantities of energy and each qubit requires specialized coherent excitation and readout structures that also operate at similar frequencies. As the number of qubits in a quantum processor is increased, these characteristics result in complex interconnect and routing schemes that limit scalability of the quantum processor.

Despite the progress made related to the formation of quantum processors, there is a need in the art for improved methods and systems for converting quantum-level signals between optical, microwave, and acoustic forms. There is also a need in the art for improved methods and system for storing qubit quantum states in a memory.

SUMMARY

The described systems and techniques relate to the field of quantum mechanics for particular use in quantum computing. More specifically, systems and techniques are described for converting (i.e., transducing) a quantum-level (e.g., a single photon) signal between an optical signal and a microwave signal using a common acoustic bandgap resonator. Systems and techniques are also described for converting a quantum-level (e.g. a single photon) signal between a microwave-frequency electrical signal (i.e., a photon) and an acoustic signal (i.e., a phonon) for storing in a phonon memory.

A system can be configured to perform particular operations or actions by virtue of having software, firmware, hardware, or a combination of them installed on or incorporated in the system that in operation causes or cause the system to perform the actions. One general aspect includes a system for transducing and storing a qubit signal. The system may include a suspended crystalline transducer for converting the qubit signal between an electrical (e.g., microwave) form and an acoustic form when the suspended crystalline transducer oscillates at a tuning frequency. The system may also include a suspended crystalline structure coupled to the suspended crystalline transducer, the suspended crystalline structure including acoustic cavities chained together, where the acoustic cavities are of differing sizes to store the qubit signal in acoustic form when the suspended crystalline transducer oscillates at the tuning frequency. Other embodiments of this aspect include corresponding computer systems, apparatus, and computer programs recorded on one or more computer storage devices, each configured to perform the actions of the methods.

Implementations may include one or more of the following features. The system may further include suspended crystalline structures, disposed in a geometric design to isolate the acoustic signal, surrounding the suspended crystalline transducer and the suspended crystalline structure. In some embodiments the suspended crystalline transducer includes a piezoelectric material overlay of a second suspended crystalline structure. The piezoelectric material may be, for example, Aluminum Nitride (AlN). In some embodiments, the system may include conductors that are electrically coupled to the piezoelectric material overlay of the second suspended crystalline structure, where the conductors form an interleaved pattern and provide alternating polarity electrical signals to the piezoelectric material to generate an oscillation at the tuning frequency.

In some embodiments, the suspended crystalline transducer includes a second suspended crystalline structure and conductors overlaying the second suspended crystalline structure. In some embodiments, the conductors are configured to form capacitive features. During transduction, the capacitive features may oscillate at the tuning frequency to generate a changing capacitance. The qubit signal in acoustic form may be generated based on the changing capacitance.

In some embodiments, the suspended crystalline transducer and the suspended crystalline structure each include silicon (Si). In some embodiments, the suspended crystalline transducer and the suspended crystalline structure are disposed in a single crystal silicon layer of a Silicon-on-insulator substrate. In some embodiments, the conductor is aluminum. In some embodiments, the qubit signal is swapped between the suspended crystalline transducer and the suspended crystalline structure when the suspended crystalline transducer oscillates at the tuning frequency. Implementations of the described techniques may include hardware, a method or process, or computer instructions usable by the system.

These and other embodiments of the invention along with many of its advantages and features are described in more detail in conjunction with the text below and attached figures.

Figure 1:
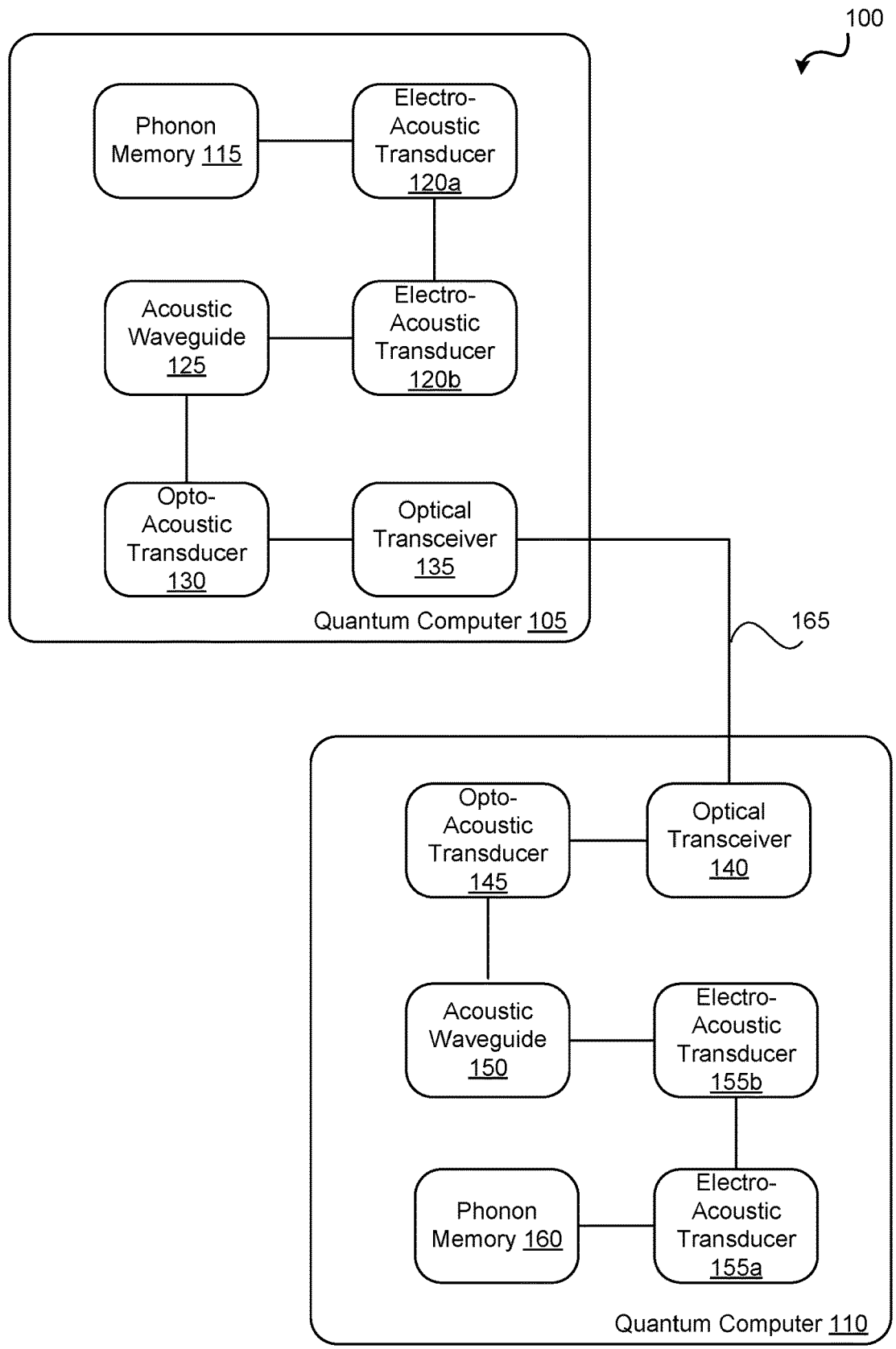
FIG. 1 is a simplified block diagram of a quantum computing system according to an embodiment.

Unless otherwise indicated, elements using the same indicator number are the same elements between differing figures. For example, phonon memory 115 in FIG. 1 is the same phonon memory 115 depicted in FIG. 10. Some elements may include multiple of the same elements, which are indicated by a letter following the indicator number.

DETAILED DESCRIPTION

The non-linearity and size of quantum level bits (i.e., qubits) gives rise to specific problems for storage and conversion of the signals between the three wave types (i.e., optical, acoustic, and electrical). Qubits in the acoustic or electrical form are of such small amplitudes (e.g., single photon level) that the qubit may be lost in the thermal noise associated with standard room temperatures (e.g., sixty degrees Fahrenheit). For this reason, the systems that manipulate qubits in electrical or acoustic form typically operate at very cold temperatures (e.g., tens of millikelvin). However, optical waves do not suffer from the effects of thermal noise at room temperature, and optical waves travel much faster (i.e., the speed of light) than acoustic waves.

Embodiments described herein include the systems and techniques for converting (i.e., transducing) a quantum-level (e.g., single photon) signal between the three wave forms (i.e., optical, acoustic, and microwave). A suspended crystalline structure is used at the nanometer scale to accomplish the desired behavior of the system as described in detail herein. Transducers that use a common acoustic intermediary transform optical signals to acoustic signals and vice versa as well as microwave signals to acoustic signals and vice versa.

Embodiments described herein include systems and techniques for storing a qubit in phonon memory having an extended coherence time. A suspended crystalline structure with specific geometric design is used at the nanometer scale to accomplish the desired behavior of the system as described in detail herein.

Prior to discussing embodiments of the invention, it may be helpful to discuss some terms.

A "qubit" is the basic unit of information in a quantum computer. A specific form of qubit can be realized using superconducting microwave circuits employing a Josephson junction which acts as a highly non-linear inductor element. The superconducting qubits typically operate at microwave frequencies between approximately 2-10 GHz. That is, their quantum state is represented as a special mixture (called a superposition) of energy states in which the difference in energy corresponds to a frequency in the 2-10 GHz range. The energy difference of these qubit states is extremely small, correspondingly to the energy of a microwave-frequency 'photon', roughly 5 to 50 micro-electronVolts. As such, each qubit requires special excitation and read-out methods (also operated at microwave frequencies), and must be protected against tiny amounts of electrical noise in the environment. Further, the superconducting qubits can be converted to an acoustic qubit (e.g., single-phonon) or optical qubit (e.g., single-photon), each of which forms has useful properties. For example, an optical qubit may not get "lost" in thermal noise of a room temperature environment like an acoustic or superconducting qubit may. An acoustic qubit is transmitted at much slower rates, which allows for much smaller components for filters and the like. As the number of qubits in a quantum processor is increased, these characteristics result in complex interconnect and routing schemes that limit scalability of the quantum processor.

The three types of waves or signals discussed herein are microwave signals, acoustic signals, and optical signals. Each of these signals are discussed at the quantum-level (e.g., single photons or single phonons). Therefore, microwaves discussed herein generally include microwaves, optical signals discussed herein are generally not visible to the human eye, and acoustic signals as discussed herein are generally not audible to the human ear. Rather, for example, acoustic signals are mechanical vibrations.

The term "quantum-level" refers to the level at which quantum mechanical effects become important. For example, most of the devices and components described herein are very small (e.g., the nanometer scale) and have very low energy (e.g., single photon).

The term "suspended crystalline structure" refers to a type of structure that may be used in creating components described herein. The crystalline structure can be, for example, Silicon, and can be suspended through a process such as that depicted and described with respect to FIG. 13.

The Opto-Electro-Acoustic Conversion of a Qubit

FIG. 1 is a simplified block diagram of a quantum computing system 100 for performing the techniques discussed herein. Quantum computing system 100 includes quantum computers 105 and 110 as well as optical network 165.

Optical network 165 may be any suitable optical network. Optical network 165 may be, for example, a single optical fiber cable connecting quantum computers 105 and 110. In some embodiments, optical network 165 may be a complex optical network connecting any number of quantum computers of which quantum computers 105 and 110 are two exemplary quantum computers.

Quantum computers 105 and 110 include phonon memories 115 and 160, electro-acoustic transducers 120a, 120b, 155a, and 155b, acoustic waveguides 125 and 150, opto-acoustic transducers 130 and 145, and optical transceivers 135 and 140. While each of quantum computers 105 and 110 comprise similar components, each may comprise more or fewer components than depicted herein. For example additional or fewer waveguides, including optical waveguides, acoustic waveguides, and electrical conductors may be included in quantum computers 105 and 110. The specific components included in quantum computers 105 and 110 are shown to provide a simplified view for ease of description.

Phonon memories 115 and 160 may be one or more acoustic cavities capable of storing a qubit for some period of time. The phonon memories 115 and 160 discussed herein are ultra-coherent phonon memories. Coherence of phonon memories 115 and 160 may be, for example, up to one (1) second. Phonon memories 115 and 160 use specific geometries to accomplish the ultra-coherency as described in more detail with respect to FIGS. 9, 10, 11A, 11B, and 11C.

Electro-acoustic transducers 120a, 120b, 155a, and 155b may be one or more transducers capable of converting a microwave to an electro-mechanical (e.g., acoustic) wave (and vice versa) at the quantum-level scale. For example, a qubit may be in the acoustic wave form and electro-acoustic transducers 120 and 155 may convert the qubit to a microwave form that may be transmitted on a conductor. Electro-acoustic transducers may be suspended crystalline structures configured with specific geometries as described in more detail with respect to FIGS. 4A-4D, 5, and 6.

Acoustic waveguides 125 and 150 may be any quantum level acoustic waveguide capable of propagating a qubit in acoustic format. Acoustic waveguides 125 and 150 may be suspended crystalline structures with specific geometries as described with respect to FIG. 3.

Opto-acoustic transducers 130 and 145 may be one or more transducers capable of converting an optical wave to a mechanical (e.g., acoustic) wave (and vice versa) at the quantum-level scale. For example, a qubit may be in the acoustic wave form and opto-acoustic transducers 130 and 145 may convert the qubit to an optical form that may be transmitted via an optical waveguide or over an optical network. Because optical waves, even at the quantum scale, are not substantially impacted by thermal noise, qubits in optical wave form may be manipulated at room temperature. Qubits in acoustic or microwave form are each impacted by thermal noise such that at room temperature the qubit may be lost in the noise. Therefore, qubits in microwave or acoustic form are typically manipulated at very low temperatures (e.g., tens of millikelvin). Opto-acoustic transducers 130 and 150 may be suspended crystalline structures configured with specific geometries as described in more detail with respect to FIGS. 2A and 2B.

Optical transceivers 135 and 140 may be any suitable optical device that may send or receive an optical signal at the quantum level. For example, optical transceivers may send and receive optical qubits.

In use, quantum computing system 100 may manipulate one or more qubits to perform quantum computing. As a simplified example for explaining the components herein, a qubit in acoustic form may be stored in phonon memory 115 of quantum computer 105. The electro-acoustic transducer 120a may extract the qubit from the phonon memory 115 as described with respect to FIG. 11A. The qubit, now in microwave form, may propagate via a conductor, for example, to electro-acoustic transducer 120b. The qubit, now in acoustic form, may propagate via acoustic waveguide 125 to opto-acoustic transducer 130. Opto-acoustic transducer 130 may convert the qubit to optical form, and the qubit may propagate, for example, to optical transceiver 135 via an optical waveguide. As mentioned previously, the quantum computer 105 is typically operated at, for example, tens of millikelvin to ensure thermal noise does not impact the qubit.

The optical transceiver 135, which may be at room temperature in some embodiments, may transmit the optical qubit to optical transceiver 140 of quantum computer 110. The optical qubit may propagate, for example, via an optical waveguide to opto-acoustic transducer 145. The opto-acoustic transducer 145 may convert the qubit into acoustic form. The acoustic qubit may propagate via acoustic waveguide 150 to electro-acoustic transducer 155b, which may convert the qubit to a microwave form. The qubit may propagate via a conductor to electro-acoustic transducer 155a, which may store the qubit in phonon memory 160.

In some embodiments, quantum processors may further process the qubit within quantum computers 105 and 110. This and many other features of quantum computers 105 and 110 are not shown herein for simplicity.

Transduction Between an Optical Signal and an Acoustic Signal

Figure 2A:
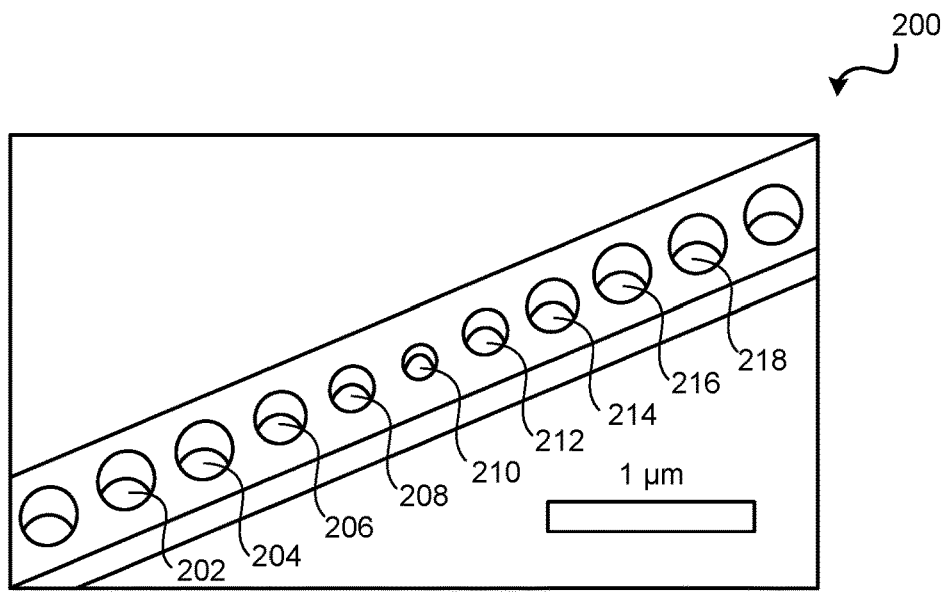
FIGS. 2A and 2B are example diagrams of opto-mechanical transducers according to an embodiment.

FIG. 2A depicts an opto-mechanical (e.g., opto-acoustic) transducer 200. The opto-acoustic transducer 200 may be opto-acoustic transducer 130 or 145 of FIG. 1. The opto-acoustic transducer 200 is a patterned Silicon nanobeam opto-mechanical crystal. The opto-acoustic transducer 200 represents a new paradigm in metamaterials, incorporating nonlinear parametric interactions to provide inter-conversion between optical wave types and acoustic wave types. Wave fields of one wave type property provides dynamic control of wave fields of another type. Stated differently, by adjusting, for example, the optical frequency of a transducer, the optical qubit can convert to an acoustic qubit.

Parametric coupling in optomechanics is possible due to the inherent nonlinearity of radiation pressure (the coupling between light and mechanical motion is dependent upon the optical intensity, not the optical field). Confining optical and acoustic energy to the nanoscale results in a nonlinearity that can be many orders of magnitude larger than conventional optical nonlinearities and presents unique capabilities for optical signal control. Opto-acoustic transducer 200 relies on the natural hierarchy of higher frequency optical photons and lower frequency microwave phonons, which have matching spatial wavelength due to the large difference in the speed of light and the speed of sound. This hierarchy, along with the radiation pressure nonlinearity, allows one to use two-photon transitions to couple optical signals to microwave phonon signal. Opto-acoustic transducer 200 is an engineered photonic and phononic bandgap structure which can be "printed" into the thin-film surface layer of a microchip.

Opto-acoustic transducer 200 may be a suspended crystalline structure. Opto-acoustic transducer 200 may be made from, for example, Silicon. As an example, a Silicon-on-insulator (SOI) substrate including single crystal silicon layer can be processed to form opto-acoustic transducer 200 having elements in the single crystal silicon layer. For example, the process used as described with respect to FIG. 13 may be used to fabricate opto-acoustic transducer 200. The nanobeam design of opto-acoustic transducer 200 allows for conversion of an optical signal to an acoustic signal. The opto-acoustic transducer 200 includes multiple vacancies (i.e., holes) 202, 204, 206, 208, 210, 212, 214, 216, and 218 where the silicon is etched away to leave the vacancy. The vacancies are of differing sizes to "trap" the signal within the area and convert it between optical and acoustic wave forms. For example, vacancy 210 is the smallest, vacancies 208 and 212 are slightly larger than vacancy 210, vacancies 206 and 214 are slightly larger still than vacancies 208 and 212, and vacancies 204 and 216 are slightly larger still. Vacancies 218 and 202 are the largest. The differing vacancy sizes create a mirroring effect such that the signal becomes trapped near the smallest vacancy 210 and the opto-acoustic transducer 200 converts the signal between optical and acoustic forms. The conversion is possible because the displacement field of the acoustic resonance (e.g., 3.5 GHz) is coupled to the co-localized optical resonance.

The opto-acoustic transducer 200 is a nanometer scale device as shown by the scale 220. Such small scale photonic crystals (i.e., the opto-acoustic transducer 200) creates a means to localize light to such a degree that radiation pressure coupling to elastic waves of the dielectric photonic structure is strongly manifest. The physics of mechanical-light interactions in materials, although well understood in the bulk, are quite often much more subtle when more complex geometries are involved, such as the patterned opto-acoustic transducer 200.

The radiation pressure nonlinearity utilized in the opto-acoustic transducer 200 described above is wavelength agnostic. The capacitive forces utilized in micro-electro-mechanical systems (MEMS) and nano-electro-mechanical systems (NEMS) devices are derived from a low frequency version of the optical radiation pressure effect. The opto-acoustic transducer 200 may be created using a silicon-on-insulator (SOI) material platform which has excellent microwave, acoustic, and optical properties. Nanoscale vacuum-gap capacitors with vacuum gaps of less than twenty (20) can be fabricated, which are sufficient to create high impedance microwave resonant circuits capable of strong coupling to RF (e.g., 100 MHz) acoustic resonances.

Figure 2B:
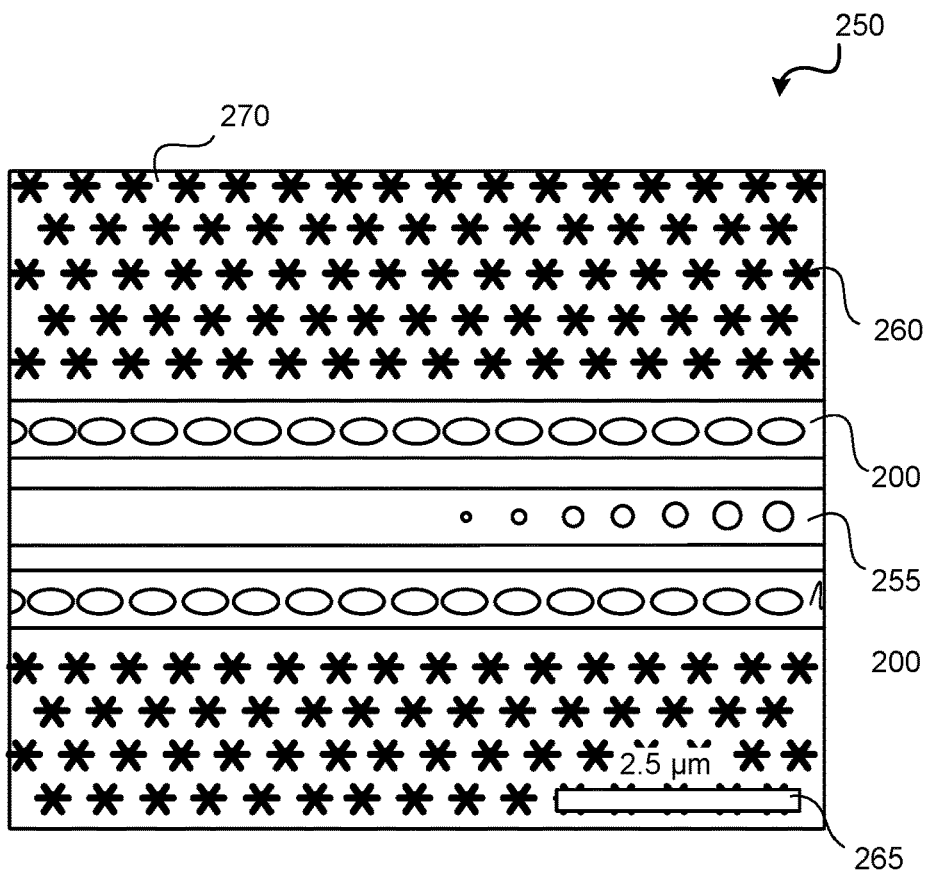

FIG. 2B illustrates a system 250 that includes a thin-film silicon two-dimensional (2D) optomechanical cavity 255. The optomechanical cavity 255 can be a suspended crystalline structure as described herein. Suspended crystalline structures may be created using a process as described with respect to FIG. 13. The system 250 as shown includes nanoscale structures "printed" on a microchip. The optomechanical cavity 255 has an opto-acoustic transducer 200 running along the length of each side of the optomechanical cavity 255. Accordingly, a microwave signal converted to an optical signal by one of the opto-acoustic transducers 200 can propagate through the optomechanical cavity 255, which is an optical waveguide. The optomechanical cavity 255 may be a suspended crystalline optical waveguide manufactured using a process as described with respect to FIG. 13. The acoustic shield 270 around the opto-acoustic transducers 200 includes multiple star-shaped vacancies 260. The acoustic shield 270 may be a suspended crystalline structure (e.g., implemented in the single crystal silicon layer of an SOI substrate and mechanically isolated from the underlying portions of the handle substrate) from which the star-shaped vacancies 260 may be etched. The acoustic shield 270 provides mirroring to isolate the acoustic signal within the optomechanical cavity 255 and the opto-acoustic transducers 200. While star-shaped vacancies 260 are depicted, any shape vacancies may be used that generate a geometric pattern that provides mirroring to isolate the acoustic signal.

Figure 3:
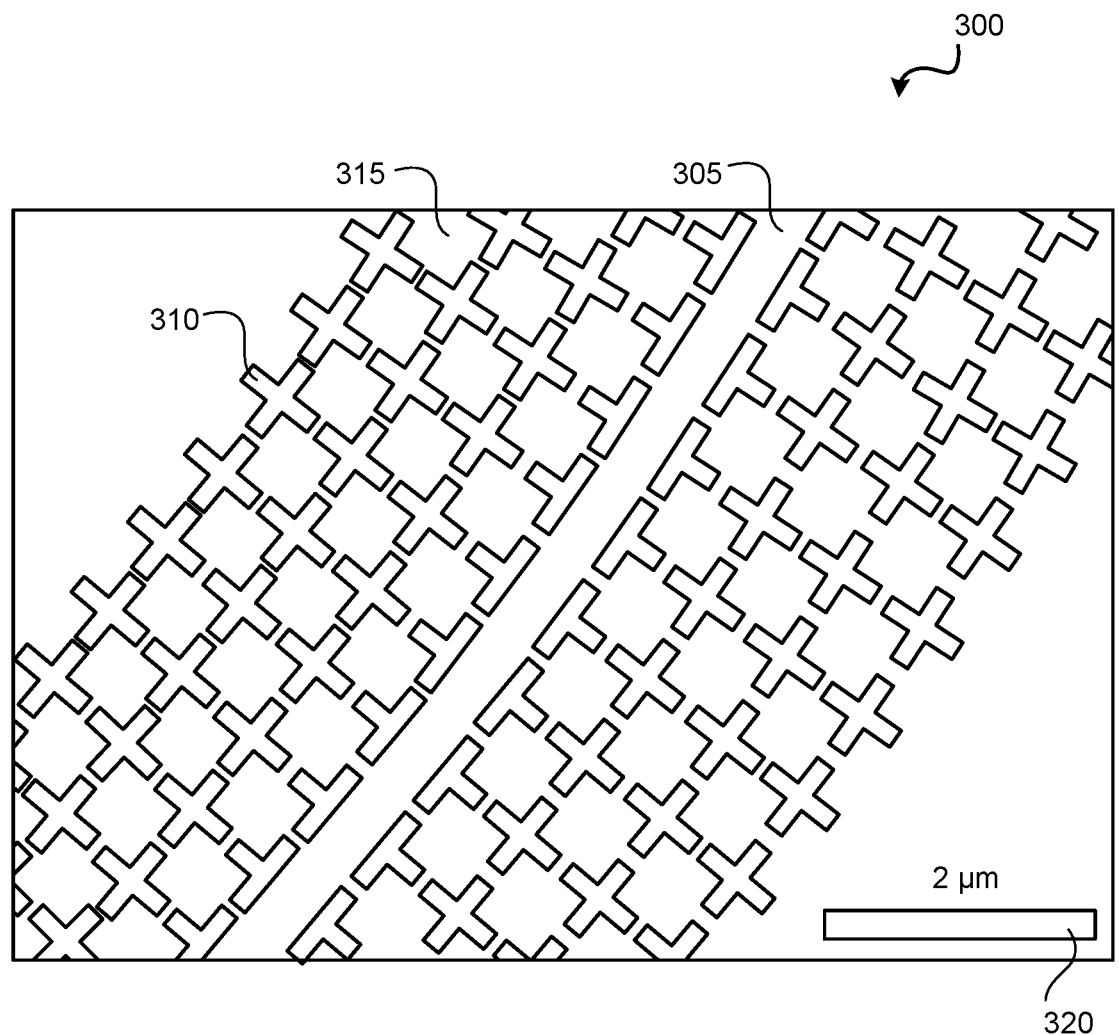
FIG. 3 is an example of a quantum level acoustic waveguide according to an embodiment.

FIG. 3 illustrates a quantum level acoustic waveguide system 300. The system 300 includes an acoustic bandgap waveguide 305, acoustic shield 315 surrounding the acoustic bandgap waveguide 305, cross-shaped vacancies 310. The cross-shaped vacancies 310 create the geometric pattern of acoustic shield 315. The acoustic shield 315 may be a suspended crystalline structure from which cross-shaped vacancies 310 are etched. In the middle of acoustic shield 315 is the acoustic bandgap waveguide 305. The acoustic bandgap waveguide 305 may also be a suspended crystalline structure. Acoustic waves may propagate through acoustic bandgap waveguide 305. The acoustic shield 315 may provide mirroring and dampening to isolate the acoustic bandgap waveguide 305 to isolate the acoustic signal and keep noise from entering the acoustic bandgap waveguide 305. The acoustic bandgap waveguide 305 may be, for example, acoustic waveguide 125 and 150 of FIG. 1. The acoustic bandgap waveguide 305 may be coupled to, for example, an opto-acoustic transducer 200 for propagating acoustic signals to and from the opto-acoustic transducer 200.

Transduction Between a Microwave Signal and an Acoustic Signal

Figure 4A:
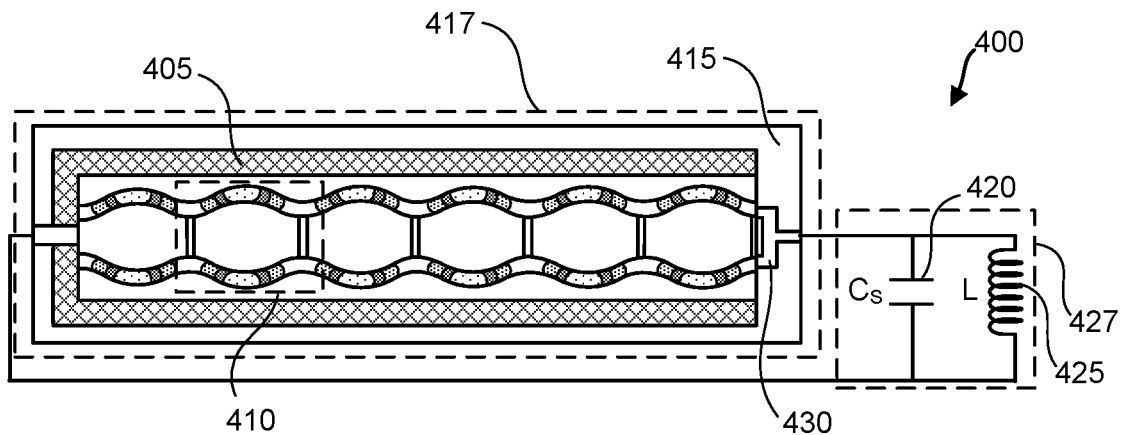
FIGS. 4A-4D are example diagrams of components of a capacitive electro-mechanical transducer according to an embodiment.

FIG. 4A illustrates an example capacitive electro-acoustic transducer 400. Capacitive electro-acoustic transducer 400 may include electro-acoustic transducer 120 or 155 of FIG. 1. Capacitive electro-acoustic transducer 400 may include elements that are suspended crystalline structures. In some embodiments, capacitive electro-acoustic transducer 400 may be formed using superconducting aluminum wiring (the electrodes 405 and 430) on a patterned sub-micrometer-thick silicon membrane. Capacitive electro-acoustic transducer 400 may include capacitive structure 417, and inductor-capacitor (LC) circuit 427. The capacitive structure 417 may include electrodes 405 and 430, multiple unit cells 410, and central nanobeam phononic crystal cavity 415. The LC circuit 427 may include capacitor 420 and inductor 425. The central nanobeam phononic crystal cavity 415 may include a silicon-on-insulator substrate that is a suspended crystalline structure created using steps described with respect to FIG. 13. The suspended crystalline structure may support electrode 405. The electrodes 405 and 430 form a top capacitor running along the top of the nanobeam phononic crystal cavity 415 and a bottom capacitor running along the bottom of the nanobeam phononic crystal cavity 415. The top capacitor and bottom capacitor are capacitive features of the capacitive electro-acoustic transducer 400. The top capacitor and the bottom capacitor each have a nanoscale vacuum gap.

Figure 4B:
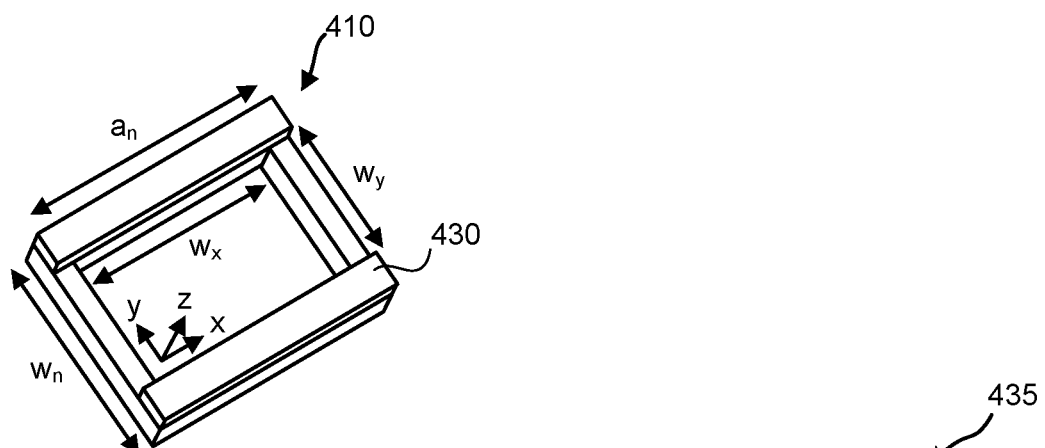

In the embodiment illustrated in FIG. 4A, electrode 405 formed on the top of the central nanobeam phononic crystal cavity 415 and is U-shaped with a width slightly wider than the width of ladder structure of the unit cells 410. Although only illustrated at the right side of the central nanobeam phononic crystal cavity 415 in FIG. 4A, electrode 430 is formed on the top surface of central nanobeam phononic crystal cavity 415 and lies in the same plane as electrode 405 as illustrated in FIG. 4B. Thus, referring to both FIGS. 4A and 4B, U-shaped electrode 405 is positioned with the opening of the U-shape on the right side of FIG. 4A such that electrode 430, which is also U-shaped, with the opening of the U-shape on the left side of FIG. 4A, is positioned between the two arms of electrode 405. Central nanobeam phononic crystal cavity 415, which supports electrode 405, and the ladder structure formed by the unit cells 410, which support electrode 430, can be fabricated as suspended structures as described herein.

A unit cell 410 of the capacitive structure 417 is depicted in more detail in FIG. 4B. In FIG. 4A, the oscillation of each unit cell 410 caused by the acoustic (mechanical) vibrations during transduction is exaggeratedly illustrated. The ladder structure of the unit cells 410 (formed by joining multiple unit cells 410 in a row) support the electrode 430. The oscillation of the unit cells 410 are stimulated by applying a microwave signal or an acoustic signal for transduction. The signal induces an oscillation of the unit cells 410. This oscillation creates a change (i.e., variation) in capacitance of the top and bottom capacitors and modulates the resonance frequency of the LC circuit (inductor 425 and capacitor 420). The change (i.e., variation) in distance between the electrodes 430 and 405 due to the oscillations generate the change in capacitance. In a parametric process, the application of a microwave tone that is detuned by the mechanical frequency converts the acoustic signal to a microwave signal and vice versa. Stated differently, the mechanical phonon causes an increase in the frequency of the microwave circuit by one mechanical frequency, which allows for the conversion of low frequency photons (one mechanical frequency below the microwave frequency) to photons at the microwave frequency. Similarly, a photon one mechanical frequency above the microwave frequency can be converted to a microwave frequency photon plus a mechanical frequency phonon.

A tuning frequency is set by the size and number of unit cells used in the central nanobeam phononic crystal cavity 415. The unit cells 410 form a ladder shape, and the size of each unit cell must be small enough to generate the high frequencies needed for quantum scale signals. Therefore, dimensions ($a_n$, $w_n$, $w_y$, $w_x$) of the unit cell 410 are determined based on the desired tuning frequency for the capacitive electro-acoustic transducer 400. The number of unit cells is selected to generate a capacitance large enough for the bottom and top capacitive features to couple the acoustic and microwave frequency elements. The tuning frequency is the microwave transition frequency of the qubit, also called a qubit frequency.

The oscillation is formed from an acoustic band near the Γ-point at wavevector $k_x$=0. For a lattice constant of $a_n$=1.55 μm, numerical finite-element method (FEM) simulations place the Γ-point frequency of the oscillation mode band at $\omega_m/2\pi$=0.425 GHz. A minimum motional mass ($m_{eff}$) is desired to increase the zeropoint amplitude $x_{zpf}$= $(h/2m_{eff}\omega_m)^{1/2}$. In the case of the central nanobeam phononic crystal cavity 415, this corresponds to minimizing both the thickness of the crystalline layer (e.g., silicon) and conductive layer (electrodes 405 and 430, which may be aluminum) and the width of the beam features. Also, a large mechanical capacitance ($C_m$) is desired, owing to limits on the achievable stray capacitance 420. The use of a Γ-point acoustic mode makes the electromechanical coupling from each unit cell 410 additive, and thus increasing the number of unit cells 410 in the central nanobeam phononic crystal cavity 415 results in an increased mechanical capacitance and participation ratio, $\eta=C_m/(C_m+C_s)$. Capacitor 420 is dominated by the stray capacitance of the planar spiral coil inductor 425 forming the LC resonator.

Figure 4C:
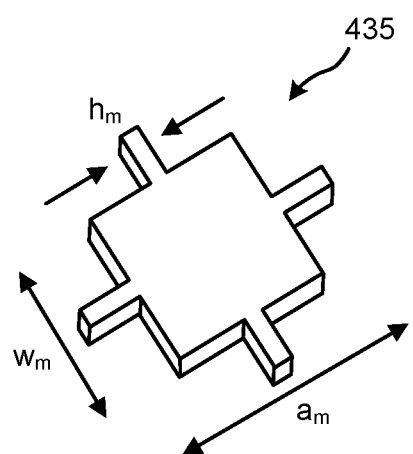

FIG. 4C illustrates a unit cell 435 of the acoustic shield 437. Acoustic shield 437 provides additional acoustic isolation from the surrounding crystalline membrane and substrate, the central nanobeam phononic crystal cavity 415 and vacuum-gap capacitor may be embedded in the middle of a cross-pattern acoustic shield 437 as shown in system 440 of FIG. 4D. The acoustic shield 437 may be a suspended crystalline structure fabricated using the processes described herein. Each unit cell 435 of the acoustic shield 437 includes a large square plate region with four narrow connecting tethers. The dimensions ($h_m$, $a_m$, $w_m$) of the unit cell 435 of the acoustic shield 437 are selected to minimize the leakage of the mechanical (acoustic) vibrations from the capacitive electro-acoustic transducer 400. The FEM-simulated acoustic band structure of an optimized acoustic shield 437 possesses a bandgap of, for example, 0.1 GHz around the central nanobeam phononic crystal cavity 415 during oscillation at the frequency of, for example, 0.425 GHz. The energy density of the central nanobeam phononic crystal cavity 415 during oscillation is well confined, dropping by, for example, 100 dB within the first two periods of the shield. In the embodiment illustrated in FIG. 4D, acoustic shield 437, as well as central nanobeam phononic crystal cavity 415 are fabricated in the single crystal silicon layer of the SOI substrate, with electrodes deposited on the single crystal silicon layer. Because the underlying BOX layer is removed under the acoustic shield 437 and the nanobeam 415, these elements are able to mechanically resonate at frequencies capable of supporting the quantum level microwaves and acoustic waves.

Figure 4D:
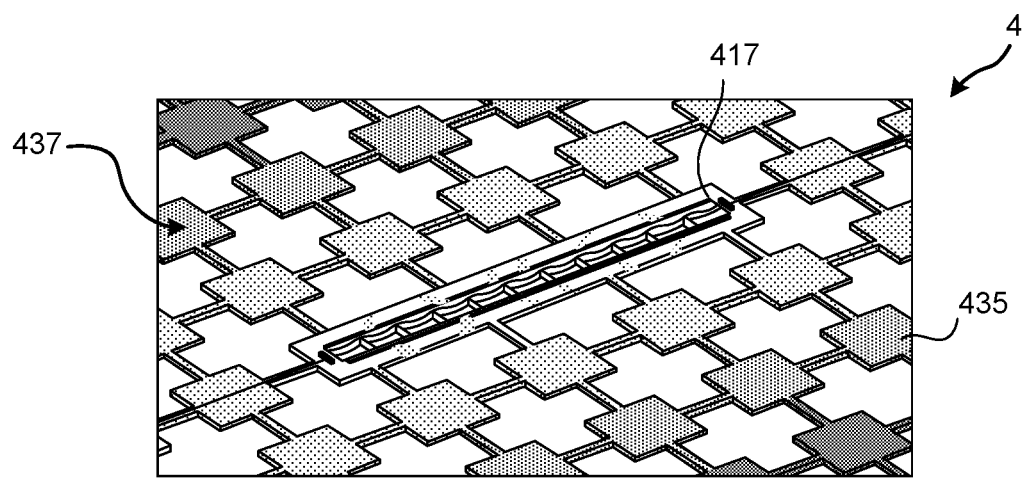
Figure 4E:
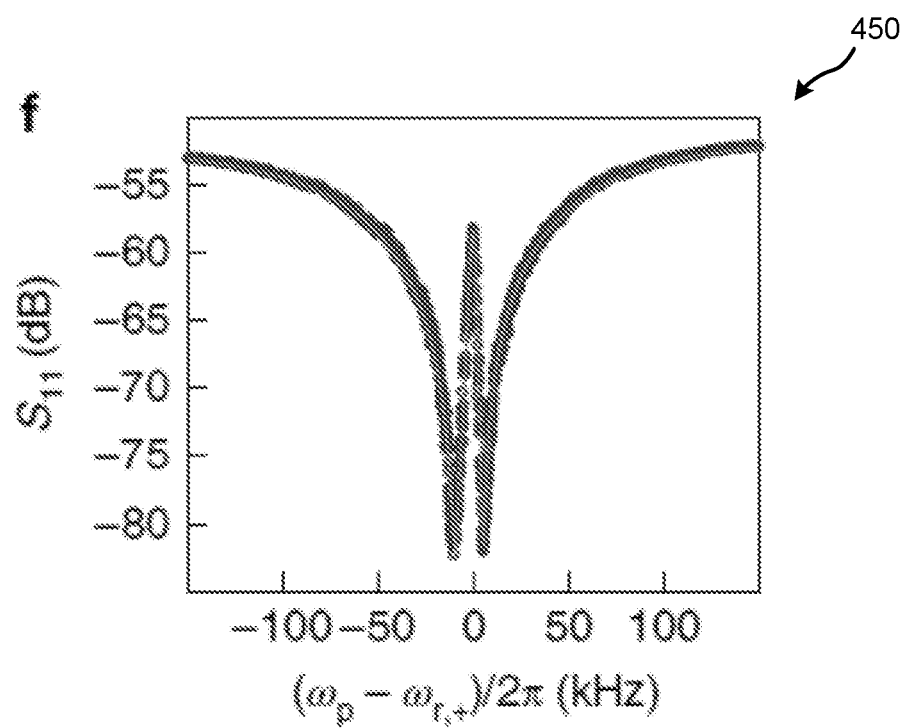
FIG. 4E illustrates a graph of the tone spectrum around the high-frequency LC resonance of the LC circuit of FIG. 4A.

FIG. 4D illustrates a plot 450 of the measured probe tone spectrum around the high frequency LC resonance for a drive detuning at two-photon resonance.

Figure 5:
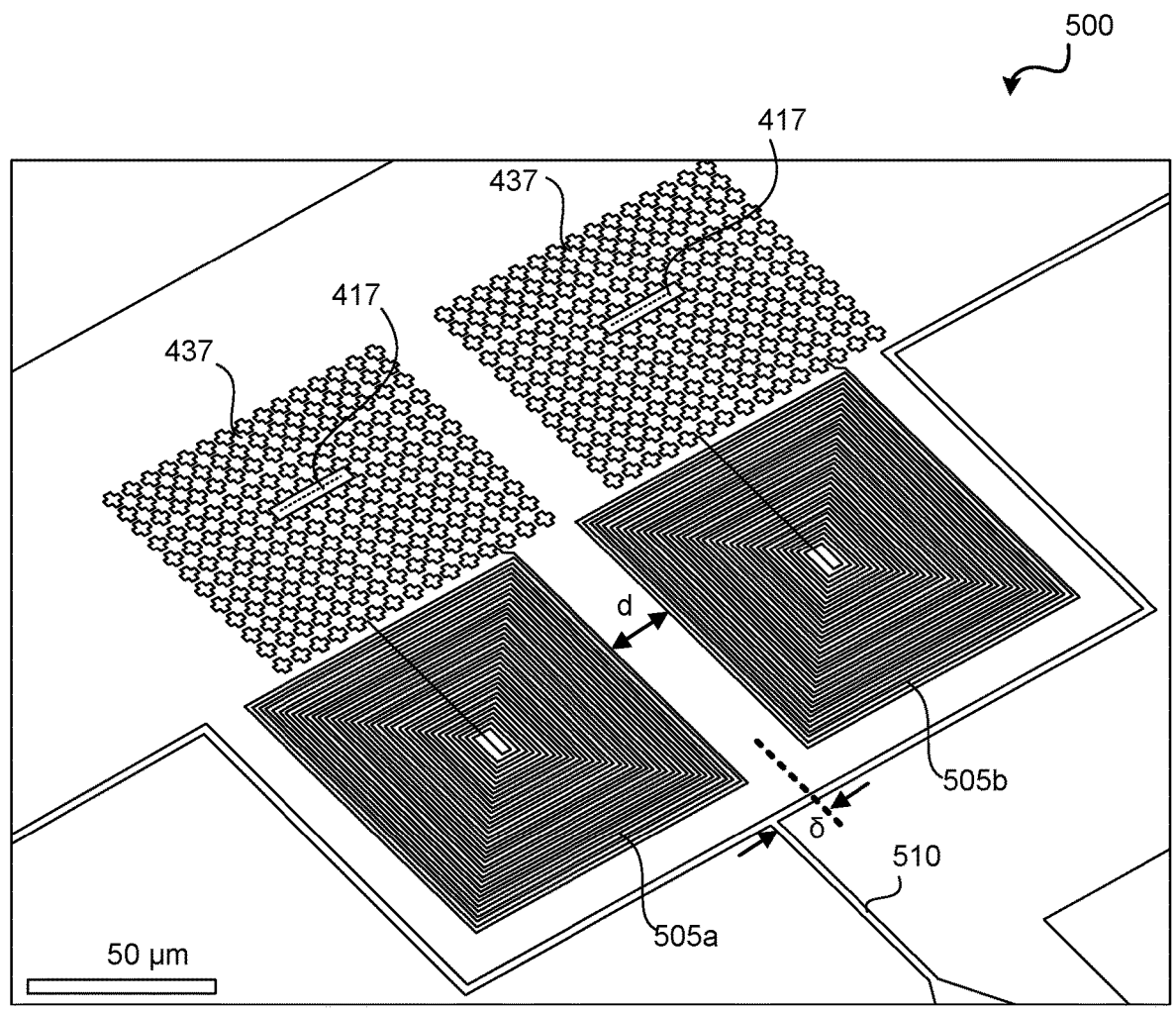
FIG. 5 is an example diagram of a system including a capacitive electro-mechanical transducer according to an embodiment.

FIG. 5 illustrates a double-cavity device 500 fabricated on, for example, a silicon-on-insulator silicon membrane. The two spiral coils 505, may be shunted via the vacuum-gap capacitor of two independent nanobeam phononic crystal cavities 415 which may be embedded inside acoustic shields 437. Inductive coupling between the two coils 505 may be set by the gap d. External coupling of the two coils 505 to a microwave drive line may be performed by shorting the end of a coplanar waveguide and splitting the current in the center trace into two paths (shunting wire 510). The offset δ from the center of the coils 505 where the wire path 510 splits in two results in asymmetric coupling to the two coils 505, allowing for an adjustable amount of coupling between the even and odd supermodes of the coupled LC resonators. Parameters for this device 500 are, for example, d=12 μm and δ=16.5 μm, resulting in a simulated coil coupling of $2J/2\pi=415$ MHz and external coupling rates of $\kappa_{e,-}/2\pi=9.6$ MHz ($\kappa_{e,+}/2\pi=102$ kHz) for the odd (even) mode. The bare (decoupled) frequency of the LC resonators may be designed to be, for example, $w_{r,0}/2\pi=10.86$ GHz for a capacitor vacuum gap of s=70 nm.

Figure 6:
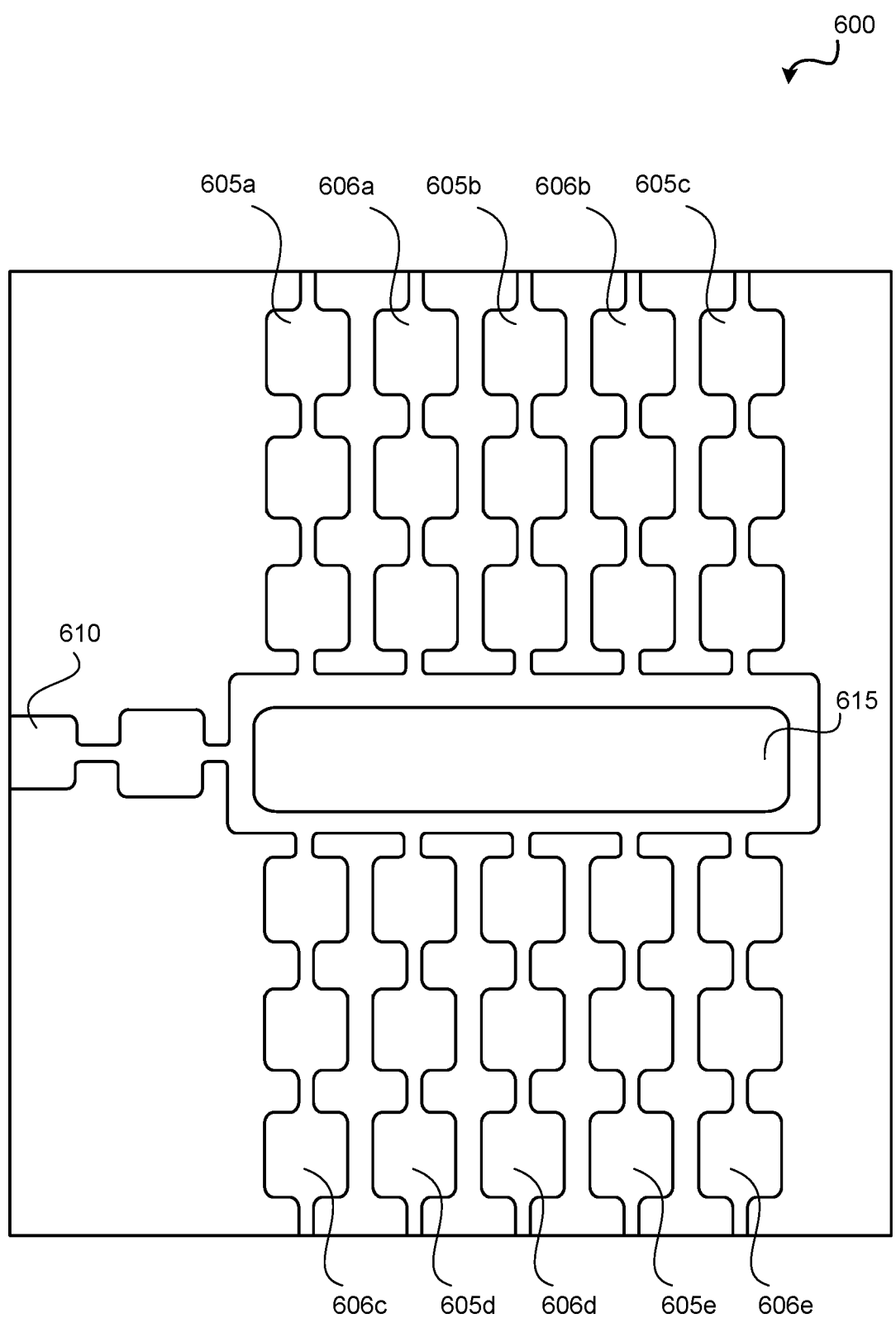
FIG. 6 is an example diagram of a piezoelectric electro-mechanical transducer according to an embodiment.

FIG. 6 illustrates a top view of a piezoelectric electro-acoustic transducer 600. The piezoelectric electro-acoustic transducer 600 may be formed using a crystalline on insulator (e.g., silicon-on-insulator) substrate. Piezoelectric electro-acoustic transducer 600 includes conductors 605, a portion of acoustic cavity 610, and transducer core 615. The acoustic cavity 610 forms a phonon memory and is described in more detail with respect to FIG. 9.

Conductors 605 include a conductive material overlaying a suspended crystalline structure. The conductive material may be aluminum. Each of the conductors 605a, b, c, d, e, and f are individual chains of crystalline cavities overlaid by the conductive material. The patterned crystalline structure is configured to block the acoustic signal that emits from the transducer core 615 (i.e., piezoelectric resonator) at its acoustic resonance frequency. The physical design of conductors 605 is implemented in compliance with bandgap engineering techniques to provide the desired mechanical isolation at the acoustic resonance frequency. The conductors 605 a, b, c, d, and e each overlay the transducer core 615, such that they alternate directions. The polarity of the voltages on each of the conductors 605a, b, and c are the same and the polarity of the voltages on each of the conductors 605 d and e are the same and the opposite of the polarity of conductors 605a, b, and c. While five conductors are shown, more or fewer conductors may be used. At transducer core 615, in an exemplary embodiment, the suspended crystalline structure (e.g., single crystal silicon) supports transducer core 615, which, in turn, supports electrically isolated conductors 605 that are operable to apply a spatially varying electric field to the transducer core 615. An alternating polarity on the conductors 605 (e.g., conductors 605a, b, and c may provide a positive voltage and conductors 605d and e may provide a negative voltage) can create a wave effect in the transducer core 615, which, as a result of the piezoelectric properties of the transducer core 615, excites a mechanical oscillation in the transducer core 615. In some embodiments, the silicon chains 606 that do not provide voltage to the transducer core 615 may be removed during the manufacturing process.

Figure 9:
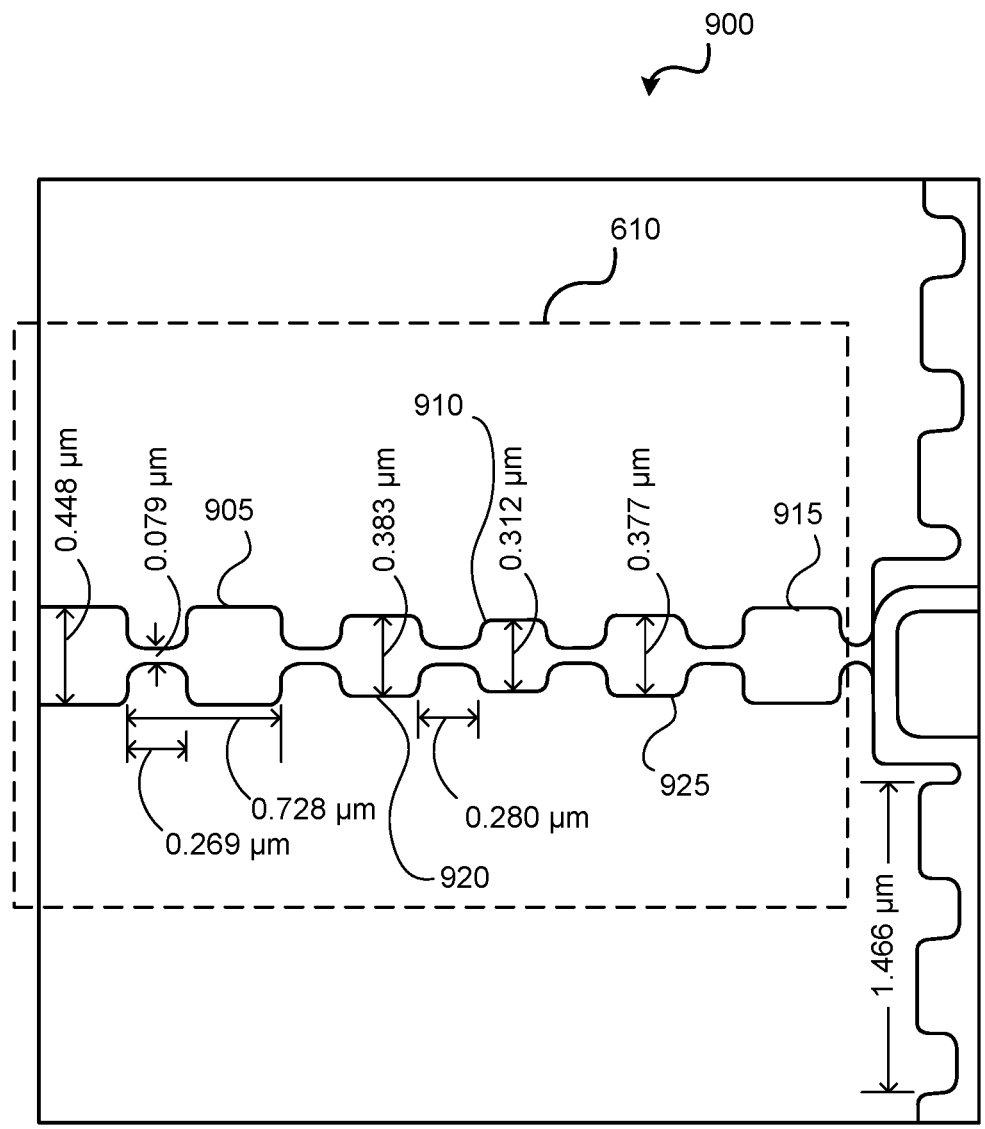
FIG. 9 is an example of a phonon memory structure according to an embodiment.

The acoustic cavity 610 may be a suspended crystalline structure, and is depicted in more detail in FIG. 9. The acoustic cavity 610 may form a phonon memory. Transducer core 615 may be piezoelectric material overlaying a suspended crystalline structure. The piezoelectric material may be, for example, Aluminum Nitride deposited on the single crystal silicon layer of the SOI substrate.

In use, providing, for example, a positive voltage on conductors 605a, b, and c and a negative voltage on conductors 605e and f, can excite the mechanical oscillation because of the piezoelectric properties of the transducer core 615. The mechanical oscillation is the acoustic form of the microwave signal.

Figure 7:
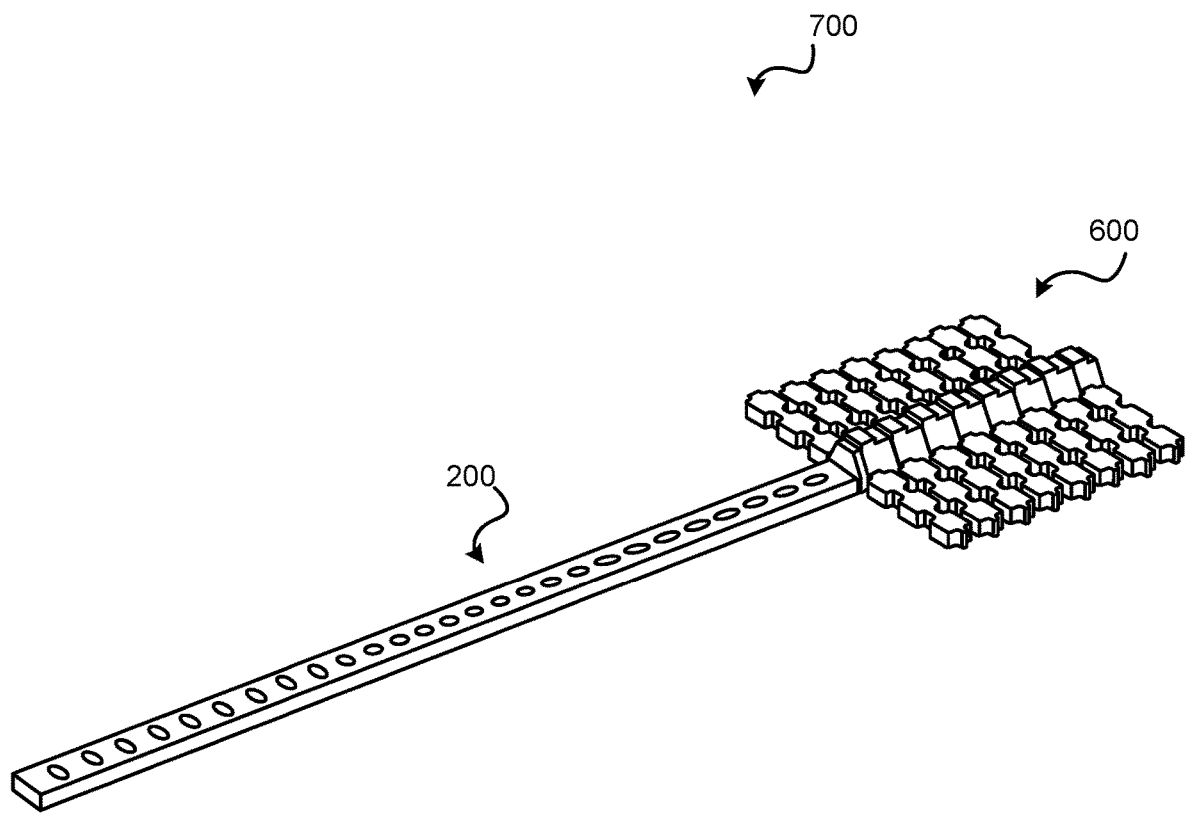
FIG. 7 is an example diagram of a transducing system for converting a microwave signal to an optical signal via a common acoustic signal according to an embodiment.

FIG. 7 illustrates an electro-opto-mechanical system 700 for transducing an optical signal to a microwave signal and vice versa using a common acoustic intermediary. The system 700 incorporates nonlinear parametric interactions to provide inter-conversion between all three wave types, enabling dynamic control of one wave type property with wave fields of another. System 700 includes piezoelectric electro-acoustic transducer 600 and opto-acoustic transducer 200. In some embodiments, an acoustic waveguide may be, for example, coupled between the piezoelectric electro-acoustic transducer 600 and opto-acoustic transducer 200. In some embodiments, capacitive electro-acoustic transducer 400 may be used instead of piezoelectric electro-acoustic transducer 600.

In use, opto-acoustic transducer 200 may convert an optical qubit into an acoustic qubit. The opto-acoustic transducer 200 will oscillate at a frequency associated with the acoustic signal. When the piezoelectric electro-acoustic transducer 600 is tuned to oscillate at a matching acoustic frequency, piezoelectric electro-acoustic transducer 600 can convert the acoustic qubit to superconducting qubit for transmitting on a conductor. The process also works to convert a qubit in microwave form to an acoustic form and then into an optical form.

Figure 8:
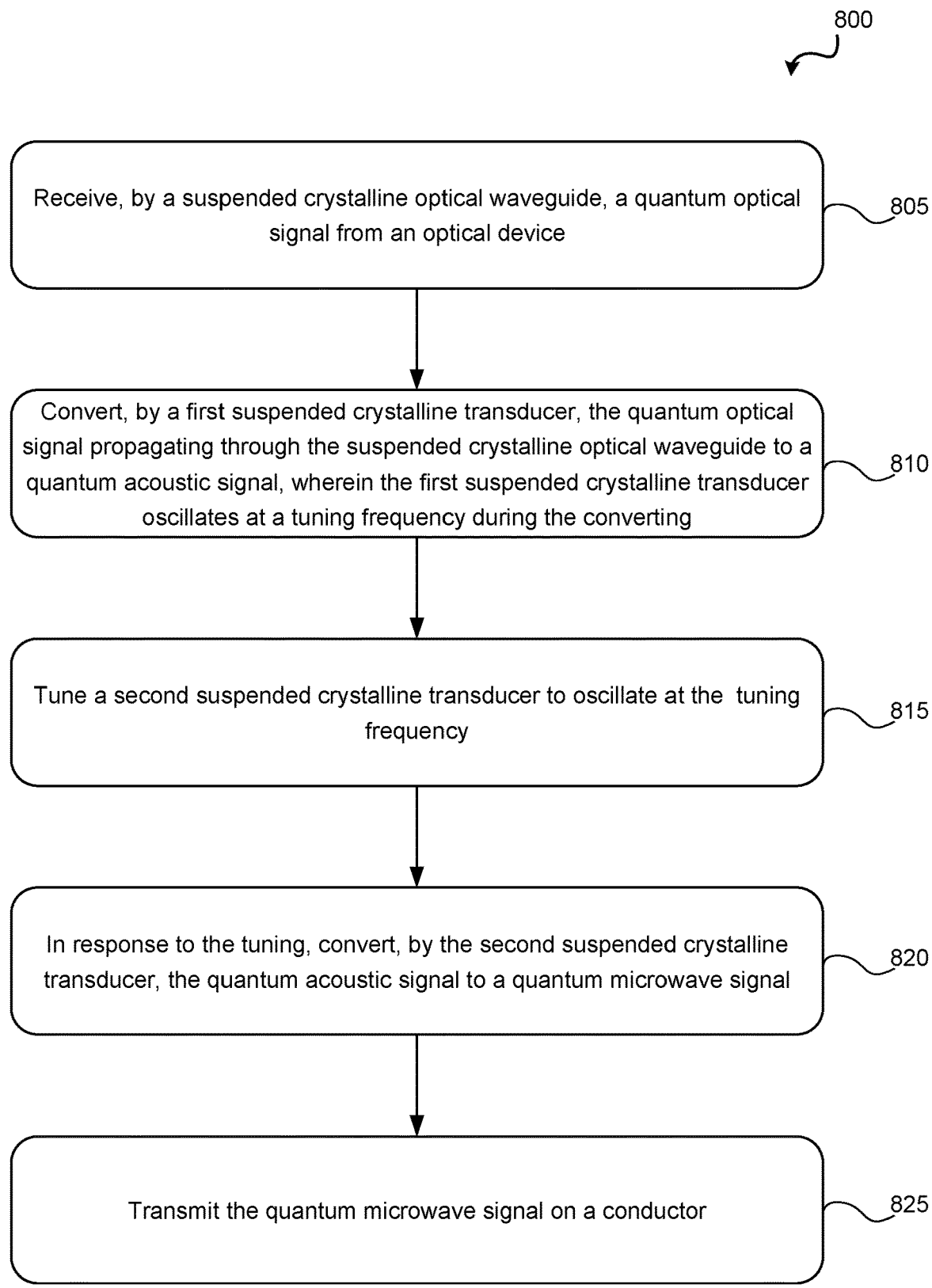
FIG. 8 is an example process for transducing a microwave signal to an optical signal via a common acoustic signal according to an embodiment.

FIG. 8 illustrates a method 800 for transducing a qubit between optical signal form and microwave signal form using a common acoustic signal form intermediary. The method 800 can be performed using, for example, quantum computing system 100 or electro-opto-mechanical system 700.

Method 800 begins at block 805 with a suspended crystalline optical waveguide receiving a single photon optical signal from an optical device. The optical waveguide may be, for example, optomechanical cavity 255. The optical device may be any suitable optical device for transceiving a single-photon optical signal.

At block 810 a first suspended crystalline transducer converts the single photon optical signal to an acoustic signal. The first suspended crystalline transducer may be, for example, opto-acoustic transducer 200. The opto-acoustic transducer oscillates at a tuning frequency to convert the single photon optical signal to a single-phonon acoustic signal. A photon pump may be used to excite the opto-acoustic transducer to oscillate at the tuning frequency.

At block 815 a second suspended crystalline transducer is tuned to oscillate at the tuning frequency. The second suspended crystalline transducer may be, for example, capacitive electro-acoustic transducer 400 or piezoelectric electro-acoustic transducer 600. The second suspended crystalline transducer may be excited by a microwave signal to oscillate at the tuning frequency. When excited to oscillate at the tuning frequency, the second suspended crystalline transducer may obtain or convert the single-phonon acoustic signal from the first suspended crystalline transducer to a single-photon microwave signal. In other words, in response to the tuning, the second suspended crystalline transducer may convert the single-phonon acoustic signal to a microwave signal at block 820.

At block 825, the second suspended crystalline transducer may transmit the microwave signal on a conductor.

Storing a Qubit in a Phonon Memory Structure

FIG. 9 is an example of a phonon memory structure 610 (also referred to as acoustic structure 610). The phonon memory structure may be, for example, phonon memory 115. The phonon memory structure 610 may be a suspended crystalline structure. The phonon memory structure 610 may include, for example, silicon, such as the single crystal silicon layer of the SOI substrate in a suspended geometry after removal of the underlying buried oxide layer. The phonon memory structure 610 is a periodic crystalline structure made up of acoustic elements 905, 910, 915, 920, and 925 that form an acoustic cavity 610 (also called phonon memory 610). The acoustic elements 905, 910, 915, 920, and 925 are of differing sizes and are chained together. The differing size crystalline acoustic elements 905, 910, 915, 920, and 925 form a mirroring structure such that the single phonon acoustic signal may be trapped, in some embodiments, in the smallest crystalline acoustic element 910. The acoustic signal is transferred from, for example, a piezoelectric electro-acoustic transducer when the piezoelectric resonator of the electro-acoustic transducer oscillates at a tuned frequency as described in more detail herein. The chain of acoustic elements 905, 910, 915, 920, and 925 forming the acoustic cavity 610 as depicted in FIG. 9 are surrounded by a vacancy. The vacancy may be created when any crystalline structure in the vacancy areas is etched away, resulting in spatial isolation of the chain of acoustic elements 905, 910, 915, 920, and 925 in part also because of removal of the BOX that originally supported the single crystal silicon layer (i.e., isolation in the direction normal to the figure) as well as the removal of portions of the single crystal silicon layer above and below the chain of acoustic cavities as illustrated in FIG. 9 (i.e., isolation in the plane of the figure).

Figure 10:
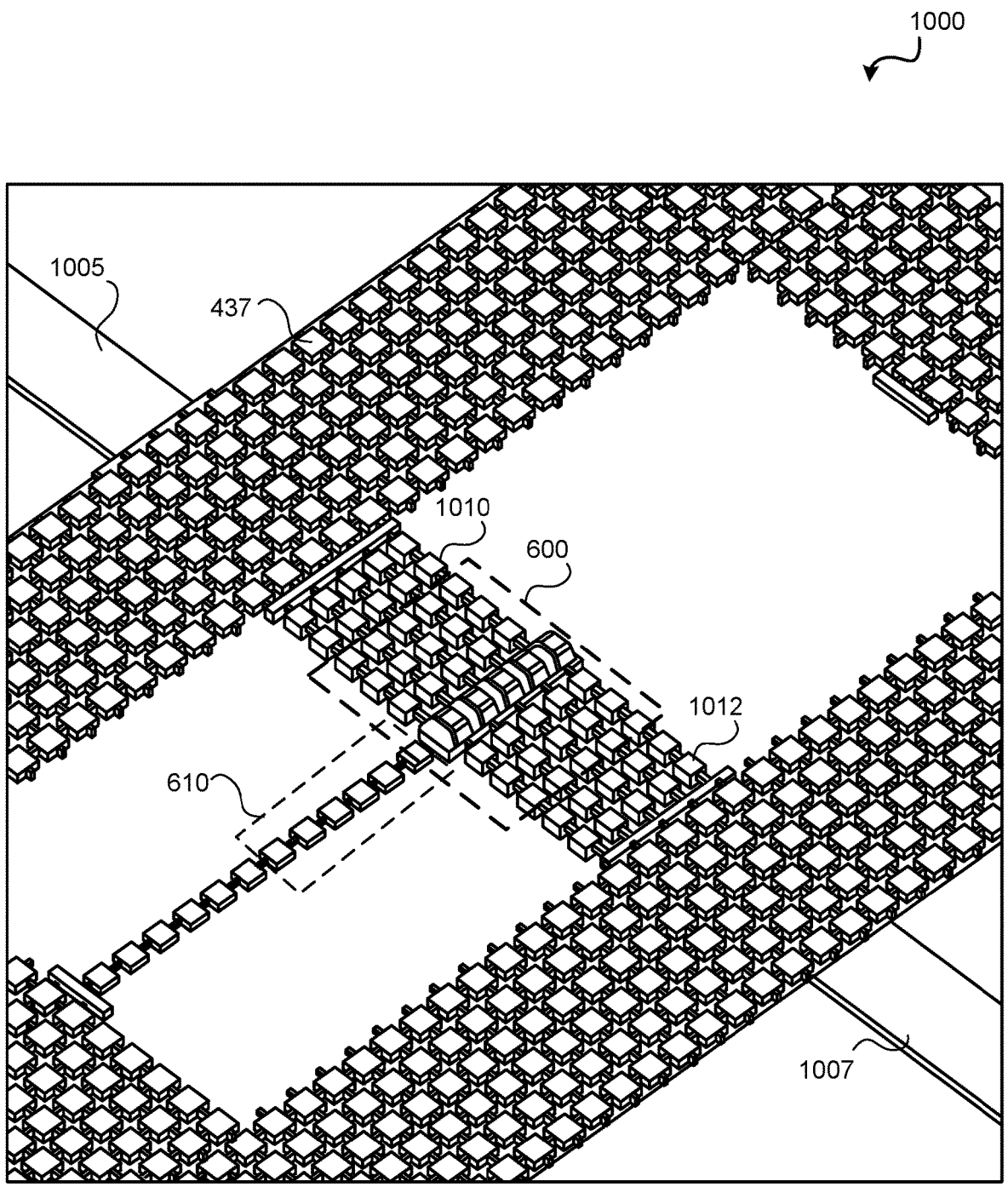
FIG. 10 is an example of a system for transferring a qubit to a phonon memory according to an embodiment.

FIG. 10 is a perspective diagram illustrating an example of a system 1000 including an electro-acoustic transducer and an acoustic shield in which the system is configured to transfer a qubit to a phonon memory according to an embodiment. The system 1000 includes phonon memory structure 610, piezoelectric electro-acoustic transducer 600, conductor 1005, and acoustic shield 437. In use, a microwave signal may arrive on conductor 1005. As described with respect to FIG. 6, the individual chains of crystalline elements overlaid by the conductor 1005 may carry opposite charge voltage from differing directions to generate a wave-like response in the piezoelectric material of the transducer core. A superconducting qubit in microwave form may arrive on the conductor at the transducer core. The transducer core may be a piezoelectric resonator. The electric charge from the conductor may excite the mechanical oscillations of the piezoelectric resonator. When the piezoelectric resonator is tuned to the tuning frequency, the electro-acoustic transducer 600 may convert the superconducting qubit (i.e., single-photon qubit) to an acoustic qubit (i.e., single-phonon qubit). At the tuned frequency, the acoustic qubit transfers into the phonon memory structure 610. In some embodiments, at the tuned frequency, the acoustic qubit swaps between the electro-acoustic transducer 600 and the phonon memory structure 610. The storage may last, for example, up to one (1) second. One second represents ultra-long coherence for storage of an acoustic qubit in a phonon memory.

Gigahertz frequency acoustical waves have micron scale wavelengths, five orders of magnitude smaller than electrical waves of the same frequency. As such, storage, readout, and bus cavities in a circuit quantum acoustodynamics (CQAD) architecture can be much more compact than the equivalent in circuit quantum electrodynamics (CQED). Information stored in the acoustical domain is much more effectively isolated because, unlike electrical signals, elastic waves don't propagate in vacuum. Coupling can only occur within the two-dimensional surface of the chip. Furthermore, the chip can be patterned with a micron-scale periodic structure (i.e., as utilized in the phonon memory) that creates a bandgap in the acoustical spectrum around the frequency of interest. Finally, the size of superconducting qubit circuits is comparable to or larger than acoustical wavelengths; thus, qubits don't couple to all parts of the acoustic spectrum through structureless dipole coupling, but only to specific wave vectors, chosen at the time of fabrication. As such, neighboring qubits can be effectively decoupled while remote qubits can be strongly coupled through virtual phonon exchange.

Phononic crystals and thin film piezoelectrics in the described architecture have the advantage of mitigating many of the issues associated with current piezo-acoustic technologies, such as Surface Acoustic Wave (SAW), Bulk Acoustic Wave (BAW), and thin-Film Bulk Acoustic Resonator (fBAR) devices. Geometric patterning of a thin surface layer film, such as the silicon device layer of silicon-on-insulator, are used to guide, trap, and diffract microwave acoustic waves with exquisite control, negligible loss, and utilizing small chip real estate. Coupling between the acoustic waves in the acoustic circuitry to electrical elements in the superconducting microwave circuits is realized using the spatially-selective employment of an additional ultra-thin layer of piezoelectric, such Aluminum Nitride in the transducer core. The spatially-selective use of an ultra-thin layer of piezoelectric material reduces acoustic and electrical losses and noise while allowing for significant coupling between the two wave fields.

Acoustic energy damping lifetimes greater than one second ($Q=5\times10^{10}$) are possible in, for example, a 5 GHz frequency silicon oscillator. Mechanical (acoustic) resonators can far exceed, by more than 3-orders of magnitude, the performance of chip-scale microwave components for quantum information storage. This performance boost is made possible due to a forbidden frequency gap (bandgap) that arises for acoustic waves of all polarizations in geometrically patterned thin films (thin-film phononic crystals). The shielding of phononic crystals protects localized phonons from tunneling (clamping loss) and Rayleigh scattering from impurities and defects. The high level of control over the dispersion of the propagation channels also enables dense packing of phononic circuits in various connection topologies while limiting cross-talk in large scale systems.

Figure 11A:
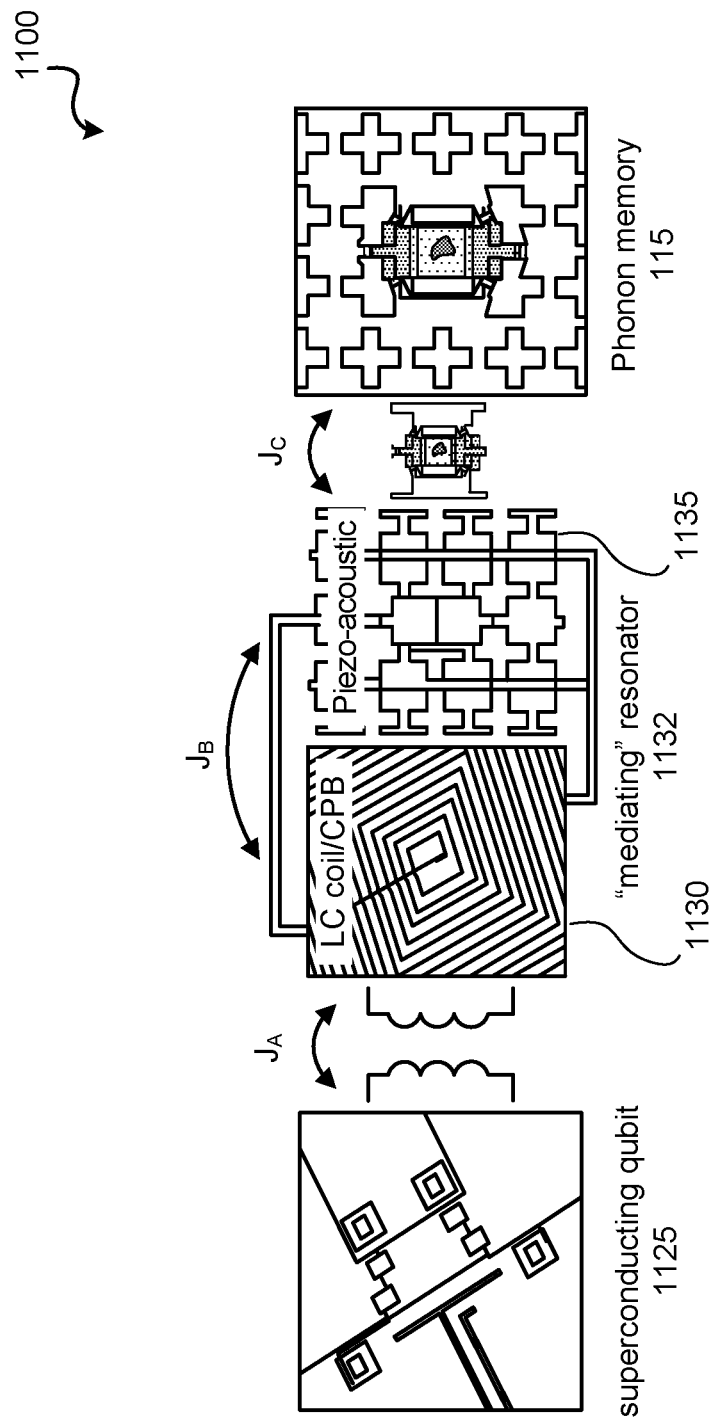
FIG. 11A is an example depiction of stages of transferring a qubit to a phonon memory according to an embodiment.

FIG. 11A is an example depiction of the stages of a system 1100 of transferring a qubit into a phonon memory. $J_A$ is the bare vacuum coupling rate between the superconducting qubit 1125 ($\omega_{01}$ transition frequency) and a high impedance LC resonator 1130 ($\omega_r$) which is detuned by $\Delta=\omega_{01}-\omega_r$. $J_B$ is the resonant vacuum coupling rate of the high impedance resonator 1130 and a nearly resonant ($\delta=\omega_r-\omega_{pa}$) piezo-acoustic cavity 1135 ($\omega_{pa}$). $J_C$ is the vacuum acoustic coupling rate between piezo-acoustic cavity 1135 and the phonon memory 115 (Wm) which is detuned from the bare piezo-acoustic cavity 1135 by $\Delta'=\omega_m-\omega_{pa}$.

Figure 11B:
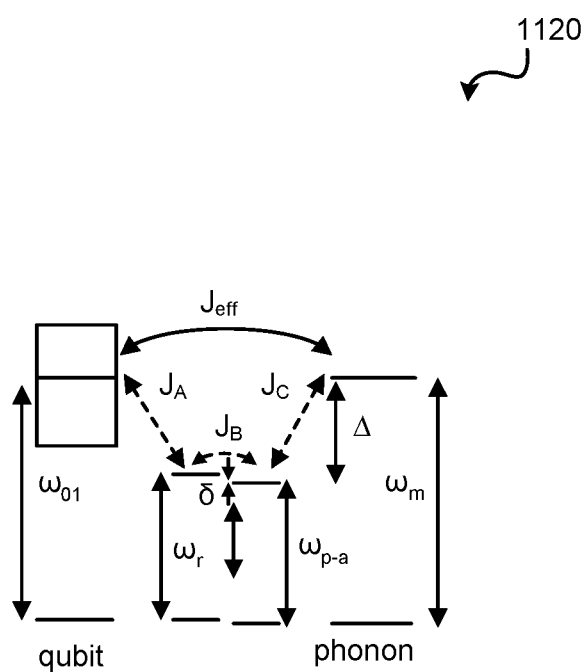
FIG. 11B is an energy level diagram of the virtual coupling scheme for connecting a superconducting qubit to a phonon memory according to an embodiment.
Figure 11C:
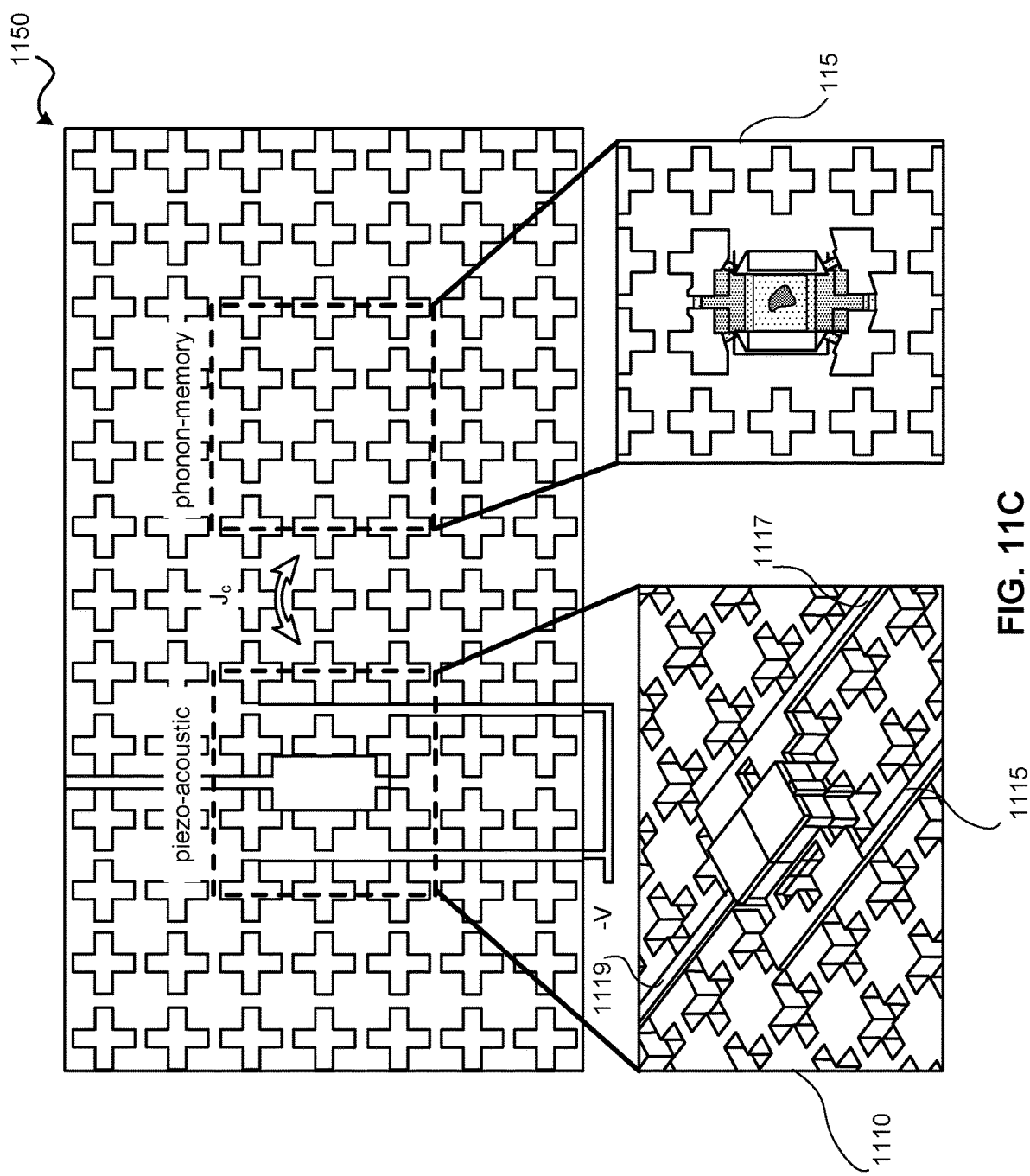
FIG. 11C is an example view of a layout of a phonon memory and a piezoelectric transducer according to an embodiment.

In the virtual coupling scenario of FIG. 11C, the phonon memory 115 may be designed to be highly detuned from the bare piezo-acoustic cavity 1135 and the superconducting qubit 1125 during the idle state of the phonon memory 115. In order to transfer the quantum state between superconducting qubit 1125 and phonon memory 115, the superconducting qubit 1125 is flux tuned into resonance with the phonon memory 115 such that $\Delta \approx \Delta'$. In the limit that $\Delta \gg J_{A,B,C}$, the effective coupling rate between superconducting qubit 1125 and phonon memory 115 is given by $J_{eff} \approx ((J_A J_C)/\Delta^2) J_B$. The excitation of the "mediating" LC and piezo-acoustic resonators 1132 is virtual, and so the fractional amount of superconducting qubit 1125 or phonon memory 115 energy that is stored in the mediating resonator 1132 during the transfer process is suppressed. The phonon memory 115 is returned to an idle state by flux tuning the superconducting qubit 1125 out of resonance with the phonon memory 115. Thus, storage of the superconducting qubit 1125 in the phonon memory 115 as well as retrieval of the superconducting qubit 1125 from the phonon memory 115 are provided by embodiments of the present invention.

FIG. 11B depicts the energy level diagram of the virtual coupling scheme, as described with respect to FIG. 11A, for connecting a superconducting qubit to a hypersonic phonon memory.

FIG. 11C is a simplified schematic diagram of a system 1150 including a piezoacoustic transducer 1110 and phonon memory 115 for storing a qubit in a phonon memory.

As shown in FIG. 11C, both of the piezoacoustic transducer 1110 and phonon memory 115 are embedded in a "cross-structure" phononic bandgap crystal (i.e., acoustic shield) with, for example, bandgap $\omega_{BG}/2\pi$=4.6-5.3 GHz. A piezo-acoustic coupling between the piezo-acoustic cavity and a LC coil resonator is, for example, $J_B/2\pi$=120 MHz. Both the piezo-acoustic cavity and the LC coil only have a single mode, thus avoiding parasitic coupling to other unintended modes. The vacuum coupling between the piezo-acoustic resonator and the phonon memory cavity can be controlled by adjusting the number of lattice periods between the cavities. A coupling of, for example, $J_A/2\pi$=20 MHz between the qubit and coil resonator.

Detuning can be chosen by considering the desired level of isolation from the mediating resonator. Assuming a superconducting (e.g., transmon) qubit T1≈100 μs and a LC coil resonator Q-factor of Qe≈5×10$^5$ (which are typical single-photon numbers on silicon on Insulator), $(J_A/\Delta)<\cdot10^{-1}$ may ensure no added dephasing of the qubit by the coil resonator. Similarly, for a T1≈100 ms for the uncoupled phonon memory and an acoustic Q-factor of $Q_a \approx 10^5$ for the piezo-acoustic cavity, $(J_C/\Delta')<\sim 10^{-2}$. A suitable detuning in this case, for example, is $\Delta/2\ \pi \approx 200$ MHz. The corresponding virtual coupling rate is then $J_{eff} \approx 200$ kHz, corresponding to a qubit-to-memory transfer time of $_{T_t} < \sim 1$ μs, far faster than the assumed qubit or memory decoherence time.

The physical implementation shown in FIG. 10 can be compared to the schematic diagram illustrated in FIG. 11C. Accordingly, transducer core 615 and phonon memory 610 illustrated in FIG. 10 are analogous to piezo-acoustic transducer 1110 and phonon memory 115 illustrated in FIG. 11C. Moreover, in addition to the piezo-acoustic transducer 1110, the central nanobeam phononic crystal cavity shown in FIG. 4A can be utilized as the electro-acoustic transducer through the use of capacitance rather than through the piezo-electric effect and integrated into the system illustrated in FIG. 11C as well as the system illustrated in FIG. 10.

Although only three electrodes 1115, 1117, and 1119 are illustrated in FIG. 11C, it will be apparent to one of skill in the art that these three electrodes 1115, 1117, and 1119 correspond to conductors 605b, c, and d, respectively, in FIG. 6 and voltages +V and −V correspond to the voltages applied to conductors 1005 and 1007, respectively, in FIG. 10.

Referring to FIG. 10, conductor 1005 and conductor 1007 support electrical signals that are transmitted to electro-acoustic transducer (e.g., piezo-electro transducer 600). The conductors 1005 are overlaid (not shown) on the acoustic shield 437 and chains 1010 such that every other chain 1010 contains an overlay of conductor 1005. Similarly, conductor 1007 is overlaid (not shown) on acoustic shield 437 and chains 1012 such that every other chain 1012 contains an overlay of conductor 1007. For example, the first, third, and fifth chain 1010 may have conductor 1005 overlay that couples to the piezoelectric material in piezo-electro transducer 600, and the second and fourth chain 1012 may have conductor 1007 overlay that couples to the piezoelectric material in piezo-electro transducer 600. Conductor 1005 and conductor 1007 can be formed using an aluminum metallization deposited on the underlying silicon layer of the SOI substrate. Adhesion and insulating layers may be utilized in some embodiments. Conductors 1005 and 1007 are overlain upon a silicon structure and are electrically connected to a plurality of conductors 605 described more fully in relation to FIG. 6. Thus, conductor 1005 provides an electrical connection (of a first polarity oscillating at microwave frequencies) to a subset (e.g., odd numbered) conductors 605 (e.g., conductors 605a, b, and c) and conductor 1007 provides an electrical connection (of a second polarity oscillating at microwave frequencies) to a second subset (e.g., even numbered) conductors 605 (e.g., conductors 605d and e). Although FIG. 10 illustrates metallization that electrically connects all of the conductors on the top left portion of the figure to conductor 1005, it will be appreciated that electrical opens can be implemented to prevent the conductors 606a, b, c, d, and e from carrying current to the transducer core. Similarly, electrical opens can be introduced to prevent the conductors opposing conductors 605a, b, and c (i.e., conductors 606c, d, and e) from carrying current to the transducer core.

As illustrated in FIG. 10, a phononic bandgap structure (i.e., acoustic shield) 437 is implemented as a two-dimensional array of silicon elements that have been mechanically isolated from the underlying handle substrate and the overlying BOX layer.

In one implementation, in order to fabricate the structure illustrated in FIG. 10, Aluminum Nitride or other suitable piezoelectric material is deposited on the single crystal silicon layer of an SOI substrate. The structure is patterned and the Aluminum Nitride is removed in locations other than the piezoelectric transducer. The single crystal silicon layer is then patterned to define the two-dimensional shapes (i.e., in the plane of the figure) of the acoustic shield 437, conductors 1005 and 1007, and phonon memory 610. A release process is then utilized to remove the BOX layer under acoustic shield 437, conductors 1005 and 1007, and phonon memory 610, resulting in the suspension of the crystalline structures.

Figure 12:
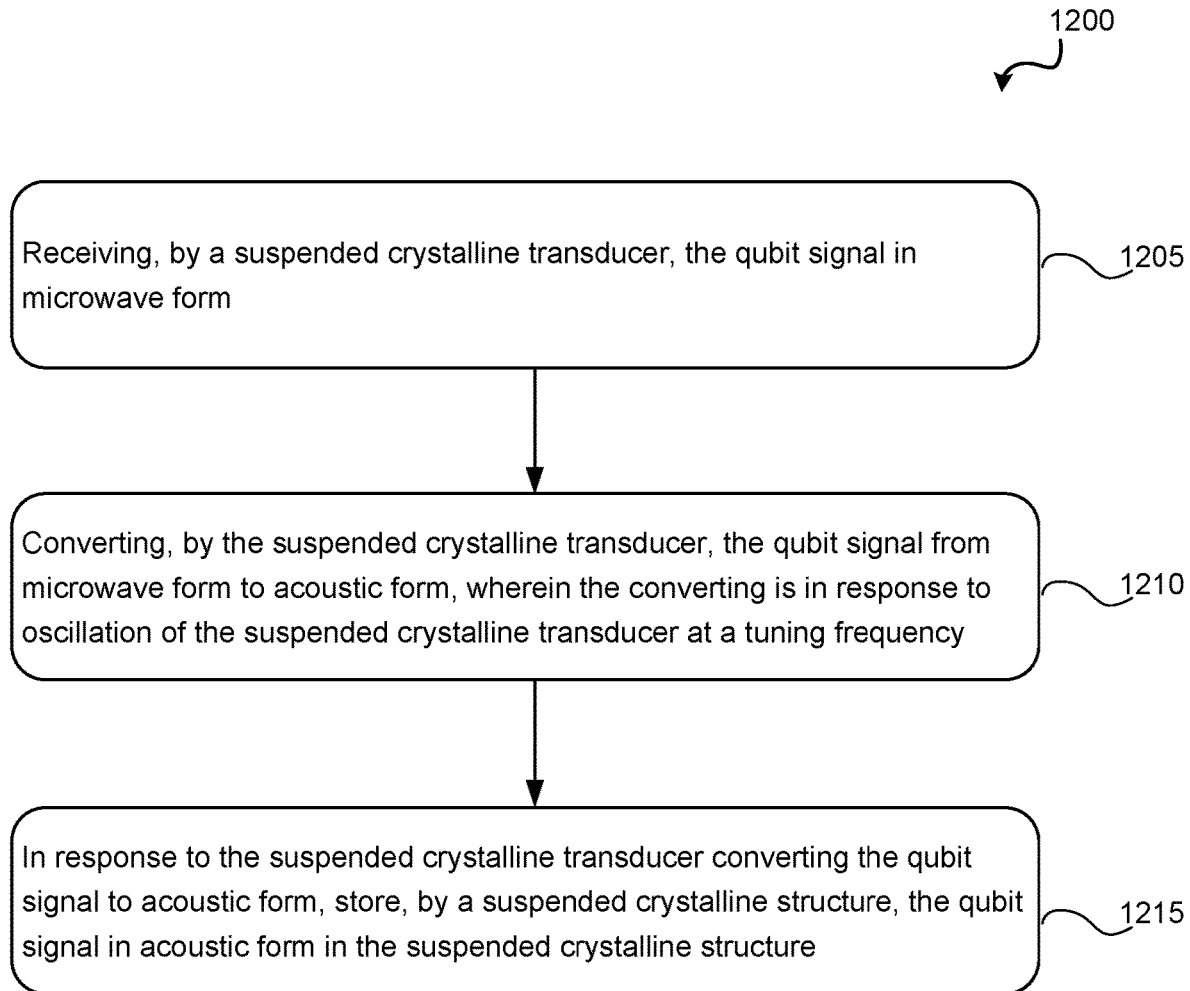
FIG. 12 is an example process for storing a qubit in a phonon memory according to an embodiment.

FIG. 12 is an example process 1200 for storing a qubit in a phonon memory. The process 1200 may be performed by, for example, system 1000 or system 1100. The process 1200 begins at block 1205 with a suspended crystalline transducer (e.g., electro-mechanical transducer 600) receiving the qubit signal in microwave form. As described with respect to FIG.

10, the qubit signal may arrive at the piezoelectric resonator from the conductor and voltages applied to the piezoelectric resonator at alternating polarities may excite the mechanical properties of the piezoelectric material causing it to oscillate and thereby converting the qubit to acoustic form at block 1210. When the oscillation of the piezoelectric resonator is tuned to an acoustic bandgap frequency (tuning frequency) associated with the phonon memory, the qubit is transmitted and stored in the phonon memory at block 1215.

Suspended Crystalline Structure Formation

Figure 13:
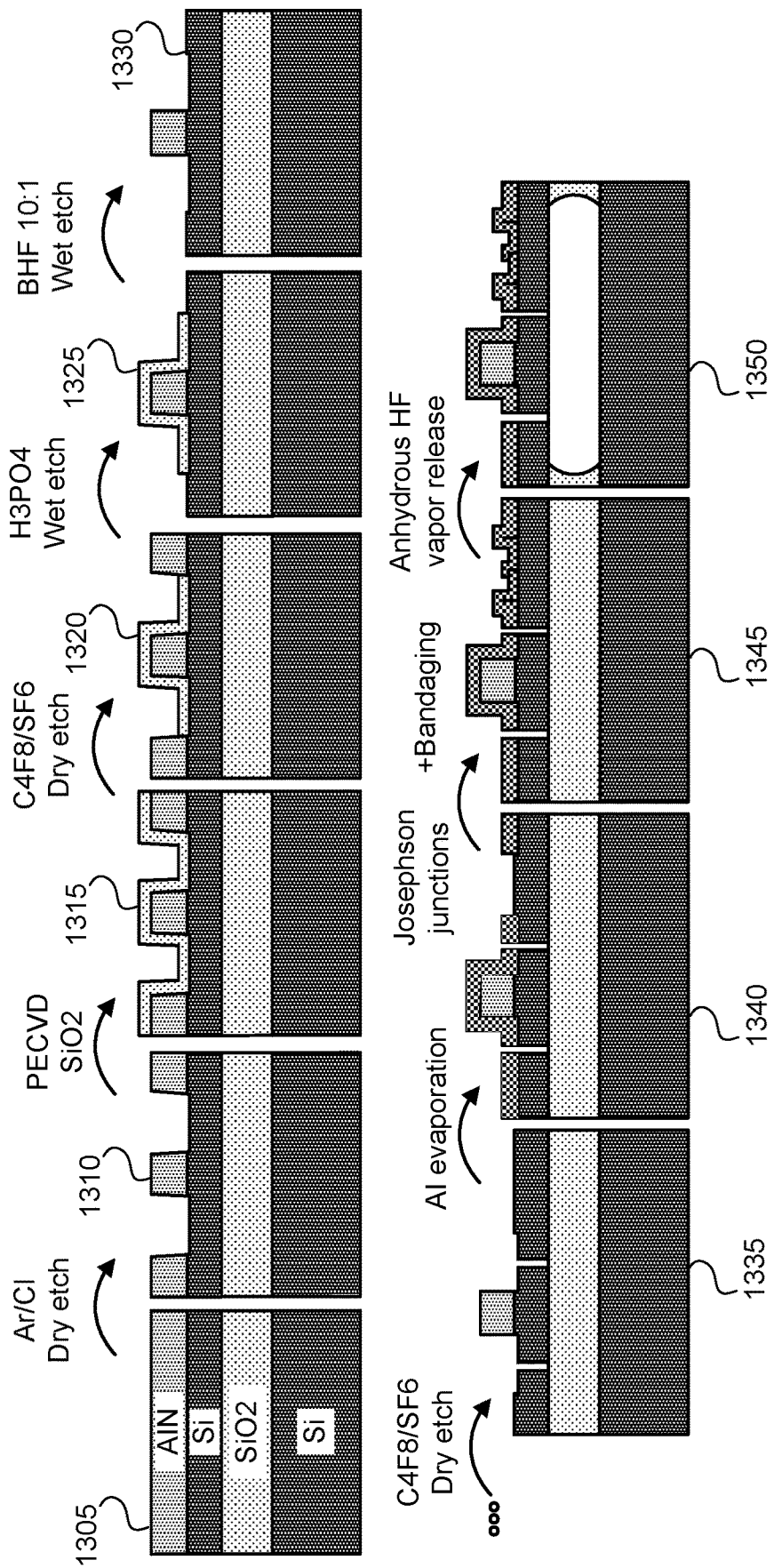
FIG. 13 is an example depiction of a process for creating a suspended crystalline structure according to an embodiment.

FIG. 13 is an example depiction of a process 1300 for creating a suspended crystalline structure. The process 1300 is to create a piezoelectric resonator portion of a microchip. Silicon-on-insulator (SOI) substrates comprise a class of silicon-based substrates in which a silicon "device layer" covers a buried silicon oxide (BOX) layer, which is on top of a silicon handle wafer. High-resistivity bulk silicon may be used successfully for superconducting qubits. The fabrication process 1300 uses high-resistivity SOI for superconducting qubits, which enables qubits to be suspended on a mechanically compliant silicon membrane (the device layer), enabling electromechanical coupling and other important functionalities. While the specific process 1300 for creating a piezoelectric resonator is depicted, portions of the process, including the anhydrous HF vapor release to remove the underlying $SiO_2$ layer, forming a suspended crystalline structure, can be used to create any of the structures discussed herein on a microchip, including, for example, suspended crystalline structures that form acoustic shields, phonon memory, conductors, electro-acoustic transducers, opto-acoustic transducers, waveguides, and so forth.

The process begins with an initial structure 1305 including a bottom silicon handle having a layer of silicon oxide, over which another layer of silicon is grown, and the top layer is Aluminum Nitride. This is a silicon on insulator substrate.

A dry etch is performed to etch away the unwanted portions of Aluminum Nitride, which is shown at structure 1310. A silicon oxide layer is grown over top of the structure, which is shown at structure 1315. Another dry etch removes the new silicon oxide from portions of the Aluminum Nitride, which is shown at structure 1320. A wet etch is then performed to remove the uncovered and unwanted Aluminum Nitride, which is shown at structure 1325. A second wet etch is performed to remove the remaining top layer of silicon oxide, which is shown at structure 1330. These steps ensure that the top layer of silicon is not damaged in the removal of the Aluminum Nitride.

Once the silicon is exposed having only the desired Aluminum Nitride remaining, a dry etch is performed to create small holes in the silicon at various locations to expose the underlying silicon oxide layer. The holes are approximately 50 nm diameter, and they are patterned into the resist using electron-beam lithography. This step is shown by structure 1335. An aluminum evaporation is performed to place an aluminum conductor over portions of the structure as shown at structure 1340. Josephson junctions and other bandaging is created as shown at structure 1345. Finally, an anhydrous HF vapor release is performed to remove the underlying silicon oxide layer. The anhydrous HF vapor release can undercut the silicon device layer by selectively removing the buried silicon oxide, without attacking the aluminum features and without destroying the Josephson junctions As shown at structure 1350, the top silicon layer is now a suspended crystalline structure.

In some embodiments, the SOI wafer consists of a 220-nm-thick silicon device layer with surface orientation and with a specified resistivity of, for example, >3000 Ωcm. Underneath the device layer is a 3-μm buried silicon dioxide ($SiO_2$) BOX layer. The device and BOX layers sit atop a silicon (Si) handle wafer of thickness 675 μm and a specified resistivity of, for example, 3000 Ωcm. Both the Si device layer and the handle wafer may be grown using the Czochralski crystal growth method. The Si device layer may be grown using the float-zone method.

Each of the calculations or operations described herein may be performed using a computer or other processor having hardware, software, and/or firmware. The various method steps may be performed by modules, and the modules may comprise any of a wide variety of digital and/or analog data processing hardware and/or software arranged to perform the method steps described herein. The modules optionally comprising data processing hardware adapted to perform one or more of these steps by having appropriate machine programming code associated therewith, the modules for two or more steps (or portions of two or more steps) being integrated into a single processor board or separated into different processor boards in any of a wide variety of integrated and/or distributed processing architectures. These methods and systems will often employ a tangible media embodying machine-readable code with instructions for performing the method steps described above. Suitable tangible media may comprise a memory (including a volatile memory and/or a non-volatile memory), a storage media (such as a magnetic recording on a floppy disk, a hard disk, a tape, or the like; on an optical memory such as a CD, a CD-R/W, a CD-ROM, a DVD, or the like; or any other digital or analog storage media), or the like.

Different arrangements of the components depicted in the drawings or described above, as well as components and steps not shown or described are possible. Similarly, some features and sub-combinations are useful and may be employed without reference to other features and sub-combinations. Embodiments of the present disclosure have been described for illustrative and not restrictive purposes, and alternative embodiments will become apparent to readers of this patent. In certain cases, method steps or operations may be performed or executed in differing order, or operations may be added, deleted or modified. It can be appreciated that, in certain aspects of the present disclosure, a single component may be replaced by multiple components, and multiple components may be replaced by a single component, to provide an element or structure or to perform a given function or functions. Except where such substitution would not be operative to practice certain embodiments of the present disclosure, such substitution is considered within the scope of the present disclosure.

It is to be understood that the figures and descriptions of embodiments of the present disclosure have been simplified to illustrate elements that are relevant for a clear understanding of the present disclosure. Those of ordinary skill in the art will recognize, however, that these and other elements may be desirable. However, because such elements are well known in the art, and because they do not facilitate a better understanding of the present disclosure, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the present disclosure, a single component may be replaced by multiple components, and multiple components may be replaced by a single component, to provide an element or structure or to perform a given function or functions. Except where such substitution would not be operative to practice certain embodiments of the present disclosure, such substitution is considered within the scope of the present disclosure. A recitation of "a", "an" or "the" is intended to mean "one or more" unless specifically indicated to the contrary.

The examples presented herein are intended to illustrate potential and specific implementations of the present disclosure. It can be appreciated that the examples are intended primarily for purposes of illustration of the present disclosure for those skilled in the art. There may be variations to these diagrams or the operations described herein without departing from the spirit of the present disclosure. For instance, in certain cases, method steps or operations may be performed or executed in differing order, or operations may be added, deleted or modified.

Furthermore, whereas particular embodiments of the present disclosure have been described herein for the purpose of illustrating the present disclosure and not for the purpose of limiting the same, it will be appreciated by those of ordinary skill in the art that numerous variations of the details, materials and arrangement of elements, steps, structures, and/or parts may be made within the principle and scope of the present disclosure without departing from the present disclosure as described in the claims.

APPENDICES

The present disclosure includes Appendix A, the entire contents of which is incorporated herein for all purposes and is considered part of this disclosure.

What is claimed is:

1. A method for transducing a qubit signal, the method comprising:
   receiving, by a suspended crystalline transducer, the qubit signal in microwave form;
   converting, by the suspended crystalline transducer, the qubit signal from microwave form to acoustic form, wherein the converting is in response to oscillation of the suspended crystalline transducer at a tuning frequency; and
   in response to the suspended crystalline transducer converting the qubit signal to acoustic form, storing, by a suspended crystalline structure, the qubit signal in acoustic form in the suspended crystalline structure.

2. The method for transducing the qubit signal of claim 1, wherein a plurality of suspended crystalline acoustic shield structures are disposed in a geometric design around the suspended crystalline transducer and around the suspended crystalline structure to isolate the qubit signal in acoustic form.

3. The method for transducing the qubit signal of claim 1, wherein the suspended crystalline transducer comprises a piezoelectric material overlay of a second suspended crystalline structure.

4. The method for transducing the qubit signal of claim 3, wherein the piezoelectric material comprises Aluminum Nitride.

5. The method for transducing the qubit signal of claim 3, further comprising:
   providing alternating polarity electrical signals via a plurality of conductors that are electrically coupled in an interleaved pattern to the piezoelectric material overlay of the second suspended crystalline structure to generate an oscillation at the tuning frequency.

6. The method for transducing the qubit signal of claim 1, wherein:
   the suspended crystalline transducer comprises a second suspended crystalline structure and a plurality of conductors overlaying the second suspended crystalline structure;
   the plurality of conductors are configured to form a plurality of capacitive features;
   during transduction, the plurality of capacitive features oscillate at the tuning frequency to generate a changing capacitance; and
   the qubit signal in microwave form is generated based on the changing capacitance.

7. The method for transducing the qubit signal of claim 6, wherein the plurality of conductors comprise aluminum.

8. The method for transducing the qubit signal of claim 1, wherein the suspended crystalline transducer and the suspended crystalline structure each comprise silicon.

9. The method for transducing the qubit signal of claim 1, wherein the suspended crystalline transducer and the suspended crystalline structure are disposed in a single crystal silicon layer of a silicon-on-insulator substrate.

10. The method for transducing the qubit signal of claim 1, further comprising:
    swapping the qubit signal between the suspended crystalline transducer and the suspended crystalline structure when the suspended crystalline transducer oscillates at the tuning frequency.

* * * * *